(12) United States Patent
Price et al.

(10) Patent No.: US 9,130,015 B2
(45) Date of Patent: Sep. 8, 2015

(54) ELECTRONIC CIRCUITS INCLUDING PLANAR ELECTRONIC DEVICES

(75) Inventors: Richard Price, Manchester (GB); Ian Barton, Manchester (GB); Scott White, Manchester (GB)

(73) Assignee: Pragmatic Printing Limited, Cambridge (GB)

( * ) Notice: Subject to any disclaimer, the term of this patent is extended or adjusted under 35 U.S.C. 154(b) by 0 days.

(21) Appl. No.: 13/511,616

(22) PCT Filed: Nov. 23, 2010

(86) PCT No.: PCT/GB2010/051952
§ 371 (c)(1),
(2), (4) Date: May 23, 2012

(87) PCT Pub. No.: WO2011/064575
PCT Pub. Date: Jun. 3, 2011

(65) Prior Publication Data
US 2012/0280400 A1 Nov. 8, 2012

(30) Foreign Application Priority Data

Nov. 24, 2009 (GB) .................................. 0920563.4

(51) Int. Cl.
*H01L 21/768* (2006.01)

(52) U.S. Cl.
CPC ........ *H01L 21/768* (2013.01); *H01L 21/76838* (2013.01)

(58) Field of Classification Search
CPC .................................................. H01L 23/5226
USPC .................................. 438/622; 257/211, 758
See application file for complete search history.

(56) References Cited

U.S. PATENT DOCUMENTS

| 7,183,146 B2 | 2/2007 | Yamazaki et al. |
| 2005/0026317 A1 | 2/2005 | Sirringhaus et al. |

(Continued)

FOREIGN PATENT DOCUMENTS

| DE | 197 02 531 A1 | 7/1998 |
| GB | 2 473 200 A | 3/2011 |

(Continued)

OTHER PUBLICATIONS

International Preliminary Report on Patentability and Written Opinion of the International Searching Authority, mailed May 30, 2012, for corresponding International Application No. PCT/GB2010/051952, 7 pages.

(Continued)

*Primary Examiner* — Kyoung Lee
*Assistant Examiner* — Ratisha Mehta
(74) *Attorney, Agent, or Firm* — Klarquist Sparkman, LLP

(57) ABSTRACT

A method for use in the manufacture of an electronic circuit comprising at least one substantially planar electronic device is disclosed. The method comprises:
  forming a structure comprising a layer of active material, at least a first conductive track spaced from and extending in a plane generally parallel to the layer of active material, and a layer of insulative material separating the first conductive track from the layer of active material, the layer of active material having a plurality of insulative features formed therein, each insulative feature at least partly inhibiting electrical current flow in the layer of active material and the plurality of insulative features defining at least a first substantially planar electronic device in the layer of active material comprising at least a respective first terminal and a respective second terminal, each terminal comprising a respective area of the layer of active material, and at least a portion of said first conductive track overlapping one of the first and second terminals;
  forming a first hole in said structure, said first hole extending through the layer of insulative material and connecting an overlapping portion of the first conductive track to one of the first and second terminals; and
  filling said first hole at least partly with electrically conductive material so as to provide an electrical connection between the first conductive track and one of the first and second terminals.

34 Claims, 31 Drawing Sheets

(56) References Cited

U.S. PATENT DOCUMENTS

2005/0224982 A1 10/2005 Kemerling et al.
2006/0091435 A1 5/2006 Liljedahl et al.
2006/0226474 A1* 10/2006 Ho et al. .................. 257/326
2007/0200156 A1 8/2007 Wunderlich et al.

FOREIGN PATENT DOCUMENTS

WO   WO 2006/061589 A1   6/2006
WO   WO 2006/120414 A2   11/2006

OTHER PUBLICATIONS

International Search Report and Written Opinion issued in PCT/GB2010/051952, mailed Apr. 5, 2011, 13 pages.

Great Britain Search Report from corresponding patent application No. GB0920563.4 dated May 14, 2010, 2 pages.

* cited by examiner

ELECTRONIC CIRCUITS INCLUDING PLANAR ELECTRONIC DEVICES

CROSS REFERENCE TO RELATED APPLICATIONS

This is the U.S. National Stage of International Application No. PCT/GB2010/051952, filed Nov. 23, 2010, which in turn claims the benefit of Great Britain Application No. 0920563.4, filed Nov. 24, 2009, which is incorporated herein in its entirety.

FIELD OF THE INVENTION

Certain embodiments of the present invention relate to methods for use in the manufacture of electronic circuits comprising at least one substantially planar electronic device, to methods of manufacturing electronic circuits comprising a plurality of substantially planar electronic devices, and to electronic circuits manufactured using such methods.

BACKGROUND TO THE INVENTION

A variety of substantially planar electronic devices are known, and include side-gated transistors for example. In such a transistor, insulative features are typically formed to interrupt a single layer of active material (that is electrically or electronically active material, such as electrically conductive or semi-conductive material) to define a relatively narrow conductive channel of active material connecting a source region or terminal to a drain region or terminal, and also to define gate regions on either side of the conductive channel to which potentials can be applied to control the conductivity of the channel. Each gate region comprises a respective area or region of the layer of active material and which lies in the same plane as the conductive channel and the source and drain regions.

A variety of substantially planar electronic devices are disclosed in the following published patent applications of the current applicant, the contents of each of which are incorporated herein by reference: WO 02/086973 A2, WO 2006/008467 A1, and WO 2006/120414 A2. These planar electronic devices include diodes (exhibiting self-switching behaviour as a result of the asymmetrical arrangement of the insulative features with respect to the two terminals of the device), other self-switching devices (that is devices exhibiting a degree of self-switching behaviour as a result of the arrangement of the insulative features), side-gated transistors (including transistors with just a single side gate and transistors with a plurality of side gates such as two side gates on either side of the conductive channel), and logic gates (such as AND gates, NAND gates, OR gates, NOR gates, etc).

From these individual devices, it is desirable to construct electronic circuits or parts of electronic circuits comprising a plurality of such devices (defined in a common layer of active material) and interconnections between those devices and connections to voltage rails, supply rails, input/output rails, ground rails, etc. It is possible to provide some of the required interconnections in the common layer of active material itself. For example, the plurality of insulative features which define the various planar electronic devices may also define one or more connecting portions of active material, each of which provide an electrical connection between one region of the layer of active material (such as a terminal of one of the electronic devices) and another region (such as a terminal of another device, or a voltage rail). Clearly, however, in general it may not be possible to provide all of the electrical connections required to define an electronic circuit from the planar devices in the layer of active material itself, and it may be necessary to provide additional interconnections outside the layer of active material (i.e. outside the plane of the devices).

However, the field of forming electronic circuits from planar electronic devices is a relatively new one, and the state of the art contains little information applicable to the problem of how to form connections between co-planar electronic devices other than in the same plane. A wide variety of techniques are known for producing electrical connections in conventional multi-layer semiconductor devices, but these are typically not directly applicable to the field of planar electronic devices, which typically utilise different materials and have different constraints associated with them. For example, numerous known techniques for forming interconnect structures from copper in multi-layer semiconductor structures incorporate features specifically adapted to address the problem of preventing contamination of the conventional semiconductor material by copper ions, which would at least degrade performance. Furthermore, in some of these known techniques for producing copper interconnects in multi-level semiconductor structures, arrays of trenches and vias are often overfilled with copper and it is then necessary to remove much of this copper, in an additional process step, to leave behind just the pattern of trenches and inter-layer vias.

To reiterate, conventional interconnect techniques are typically addressing very different problems from those associated with the formation of electrical circuits from a plurality of co-planar electronic devices and those known techniques are therefore typically not applicable in the field of the present invention.

SUMMARY OF THE INVENTION

It is an object of certain embodiments of the invention to provide methods for use in the manufacture of electronic circuits comprising at least one substantially planar electronic device. It is an object of certain embodiments to provide methods of manufacturing electronic circuits comprising a plurality of substantially planar electronic devices. It is an object of certain embodiments to provide electronic circuits comprising a plurality of substantially planar electronic devices formed in a single, common layer of active material.

Aims of certain embodiments of the invention, and problems addressed by or solved by certain embodiments of the invention include the following:

To provide a programmable/configurable circuit comprising a plurality of planar (e.g. co-planar) electronic devices;

How to form connections to substantially planar electronic devices to enable them to be incorporated in electronic circuits;

How to form out-of-plane interconnections between co-planar substantially planar electronic devices, or between a substantially planar electronic device and some other (e.g. co-planar) circuit element (e.g. voltage rail) to enable them to be incorporated in electronic circuits;

How to selectively make connections to a plurality of co-planar electronic devices (and in particular, nano electronic devices) to determine (i.e. program or configure) characteristics or a function of the resultant circuit;

How to make out-of-plane interconnections between co-planar electronic devices in a manner compatible with high throughput processing (e.g. printing);

How to make interconnections to nano electronic devices and between nano electronic devices to incorporate them in electronic circuits without requiring nano-scale accuracy for the interconnection technique;

Providing user-configurable circuits;

Providing structures comprising a plurality of planar electronic devices, the structures being programmable/configurable into a plurality of different circuits (e.g. a plurality of different logic circuits);

Providing an array of co-planar devices and an associated interconnection technique able to form a plurality of different circuit configurations;

Providing a structure comprising a plurality of co-planar electronic devices (e.g. nano electronic devices) which can be processed to form a plurality of different circuit configurations.

According to a first aspect of the present invention there is provided a method for use in the manufacture of an electronic circuit comprising at least one substantially planar electronic device, the method comprising:

forming a structure comprising a layer of active material, at least a first conductive track spaced from and extending in a plane generally parallel to the layer of active material, and a layer of insulative material separating the first conductive track from the layer of active material, the layer of active material having a plurality of insulative features formed therein, each insulative feature at least partly inhibiting electrical current flow in the layer of active material and the plurality of insulative features defining at least a first substantially planar electronic device in the layer of active material comprising at least a respective first terminal and a respective second terminal, each terminal comprising a respective area of the layer of active material, and at least a portion of said first conductive track overlapping one of the first and second terminals;

forming a first hole in said structure, said first hole extending through the layer of insulative material and connecting an overlapping portion of the first conductive track to one of the first and second terminals; and filling said first hole at least partly with electrically conductive material so as to provide an electrical connection between the first conductive track and one of the first and second terminals.

Thus, in this first aspect of the invention the structure comprising the patterned layer of active material and the conductive track or tracks is formed first, and then the first hole is formed and then filled to provide the inter-layer connection (or via) connecting the relevant portion of the active layer to the conductive track or tracks. The structure may be described as a multi-layer structure.

In certain embodiments, a first portion of the first track overlaps the first terminal and a second portion of the first track overlaps the second terminal, and forming the first hole comprises forming the first hole so as to connect a selected one of the first and second portions to a corresponding one of the first and second terminals, whereby said filling provides an electrical connection between the first conductive track and a selected one of the first and second terminals.

As will be appreciated, the selected positioning of the first hole thus provides a means of configuring or programming a circuit; that is the active layer may include a plurality of planar electronic devices, and a plurality of conductive tracks may be also provided on the structure, and then a circuit may be configured by the selected positioning of filled holes (vias).

In certain embodiments, a first portion of the first track overlaps the first terminal and a second portion of the first track overlaps the second terminal, and forming the first hole comprises forming the first hole so as to connect the first portion to the first terminal, the method further comprising forming a second hole in said structure, the second hole extending through the layer of insulative material and connecting the second portion to the second terminal, and filling the first and second holes at least partly with electrically conductive material so as to provide electrical connections between the first conductive track and the first and second terminals.

Again, it will be appreciated that such methods can be used to configure or program an electronic circuit from a multi-layer structure in which the tracks and electronic devices may be connected in a plurality of different ways.

In certain embodiments, a further portion of the first conductive track overlaps a further area of active material in the layer of active material, the method further comprising forming a further hole in said structure, the further hole extending through the layer of insulative material and connecting the further portion to the further area, and filling the further hole at least partly with electrically conductive material so as to provide an electrical connection between the first conductive track and the further area.

Thus, the formation and subsequent filling of the first and further holes is able to connect together, by means of the first conductive track, one area of the active layer to another. This provides a means of taking out-of-plane connections between areas of the active layer, with these out-of-plane connections being able to provide connections not possible within the active layer itself, such as connections bridging over insulative features.

In certain embodiments the further area is a terminal of a second substantially planar electronic device defined in the layer of active material by the plurality of insulative features. In alternative embodiments, the further area may be an area of active layer other than a terminal area, for example an area corresponding to an input pad, output pad, voltage rail, etc.

In certain embodiments, the plurality of insulative features define a plurality of substantially planar electronic devices, including said first device, in the layer of active material, each device comprising at least a respective first terminal and a respective second terminal, and said first conductive track overlaps at least one of the respective first and second terminals of each of said plurality of devices.

Such methods may further comprise selecting to form the first hole so as to selectively connect the first track to the first device from the plurality of devices. Once again, this illustrates how methods embodying the invention may be used to program or configure a circuit from a structure comprising a plurality of planar electronic devices connectable in a plurality of different ways.

In certain embodiments, the method further comprises forming a plurality of holes in the structure, the plurality of holes including said first hole, and each hole extending through the layer of insulative material and connecting an overlapping portion of the first conductive track to one of the first and second terminals of a respective one of the plurality of devices; and filling each hole at least partly with electrically conductive material so as to provide a respective electrical connection between the first conductive track and one of the first and second terminals of a respective one of the plurality of devices.

In such embodiments, the number of said holes may be smaller than the number of said devices, such that the method provides electrical connections between the first track and a selected subset of the plurality of devices. Thus, in certain embodiments, electrical connections (vias) may be made between pre-formed planar electronic devices and pre-formed conductive tracks to leave out some of the possible devices, and connected together the remainder so as to achieve a desired circuit performance or operation.

In certain embodiments, said structure comprises a second conductive track, at least a respective portion of each of the first and second tracks overlaps the first terminal of the first device.

In such embodiments, said structure comprises a second conductive track, at least a respective portion of each of the first and second tracks overlaps the first terminal of the first device.

In such embodiments, the method may further comprise selecting to form said first hole so as to selectively connect the first terminal of the first device to the first track and not the second track.

In certain embodiments, said first hole connects the first track to the first terminal of the first device, and the method further comprises:
  forming an additional hole in said structure, said additional hole extending through the layer of insulative material and connecting an overlapping portion of the second conductive track to the first terminal; and
  filling said additional hole at least partly with electrically conductive material so as to provide an electrical connection between the second conductive track and the first terminal.

In certain embodiments, said structure comprises a second conductive track, at least a portion of the first track overlapping the first terminal of the first device and at least a portion of the second track overlapping the second terminal of the first device.

In certain embodiments, said first hole connects the first track to the first terminal of the first device, and the method further comprises:
  forming an additional hole in said structure, said additional hole extending through the layer of insulative material and connecting an overlapping portion of the second conductive track to the second terminal; and
  filling said additional hole at least partly with electrically conductive material so as to provide an electrical connection between the second conductive track and the second terminal.

Thus, it will be appreciated that embodiments of the invention may be used to selectively connect up a plurality of tracks to a plurality of planar electronic devices provided in a common active layer of semiconductive material, for example.

A variety of techniques may be used in embodiments of the invention to form the or each hole. For example, certain embodiments comprise forming the or each hole using a technique selected from a list comprising: drilling (e.g. laser, mechanical, micro); punching; etching; imprinting; ablating; chemical lift-off.

In certain embodiments, forming the or each hole comprises shaping the or each hole to facilitate filling with electrically conductive material. This may, for example, take the form of forming the hole to have a relatively wider portion where it meets the exposed surface of the insulative layer. For example, the or each hole may be tapered, or stepped, or conical.

A variety of techniques may be used to at least partly fill the or each hole. For example, the or each hole may be filled using a technique selected from a list comprising: conductive ink; sputter-coating; vacuum evaporation; fluidic wicking; coating (e.g. spin, dip, blade, bar, spray, slot-die); printing (e.g. inkjet, gravure, offset, screen, flexo).

In certain embodiments, forming the structure comprises forming the or each conductive track on a surface of the layer of insulative material. A variety of techniques may be used for forming the conductive track on the surface. For example, in certain embodiments the or each conductive track is formed using a technique selected from a list comprising: deposition (e.g. vacuum, sputter); deposition (e.g. vacuum, sputter) and selected removal; coating (e.g. spin, dip, blade, bar, spray, slot-die); printing (e.g. inkjet, gravure, offset, screen, flexo).

Alternatively, forming the structure may comprise forming the or each conductive track such that each conductive track is let into a surface of the insulative layer. For example, the or each conductive track may be formed in a respective trench, groove, recess or depression in a surface of the layer of insulative material.

In certain embodiments, the first device comprises a channel of active material defined by said insulative features, the channel having a conductivity dependent upon a voltage applied to at least one terminal of the first device.

In such embodiments, the first device may comprise at least one side-gate terminal, adjacent the channel, to which a potential may be applied to control the conductivity of the channel.

In certain embodiments, this channel connects the first and second terminals of the first device.

In certain embodiments, at least one of the first and second terminals of the first device is a side-gate terminal, adjacent the channel, to which a potential may be applied to control the conductivity of the channel.

In certain embodiments, the channel has a width in the range: 30-300 nm and a length in the range: 200-2000 nm.

In certain embodiments, the structure is formed such that the layer of insulative material is in direct contact with the layer of active material.

Alternatively, in certain embodiments the structure comprises at least one intermediate layer separating the layer of active material from the layer of insulative material.

In certain embodiments, the layer of insulative material is a first layer of insulative material and said structure comprises a second layer of insulative material and at least one further conductive track, each further conductive track extending in a plane generally parallel to the layer of active material and being separated from the layer of active material by the second layer of insulative material, the method further comprising forming at least one hole extending from a respective area of the layer of active material, to a respective further conductive track and filling that hole at least partly with electrically conductive material to form an electrical connection between the respective area of the layer of active material and the respective further conductive track.

In certain embodiments, the first and second layers of insulative material may be formed on the same side as the active layer. However, in alternative embodiments, the first and second layers of insulative material are arranged on opposite sides of the patterned layer of active material.

Thus, in certain embodiments conductive tracks may be formed on either side of the layer of active material, and electrical connections may be made to connect the tracks of each layer to selected positions in the active layer. This enables a wider variety of connections to be made (and enables the plurality of electronic devices in the active layer to be connected in a wider range of configurations) than would be possible with just a single layer of connecting tracks.

It will be appreciated, that this ability to provide a wider variety of interconnections between the electronic devices, by utilising more than one layer of conductive tracks, applies to embodiments in which the first and second insulative layers are formed on the same side of the active layer, and to embodiments where they are formed on opposite sides. Forming the layers of conductive tracks on opposite sides of the active layer does, however, provide the advantage that it is easier to design each conductive track layer pattern.

Another aspect of the present invention provides a method of manufacturing an electronic circuit comprising a plurality of substantially planar electronic devices, the method comprising:

forming a structure comprising a layer of active material, a plurality of conductive tracks spaced from and extending in a plane generally parallel to the layer of active material, and a layer of insulative material separating the conductive tracks from the layer of active material, the layer of active material having a plurality of insulative features formed therein, each insulative feature at least partly inhibiting electrical current flow in the layer of active material and the plurality of insulative features defining a plurality of substantially planar electronic devices in the layer of active material, each device comprising at least a respective first terminal and a respective second terminal, each terminal comprising a respective area of the layer of active material, and said conductive tracks overlapping said terminals at a plurality of positions;

forming a plurality of holes in said structure, each hole extending through the layer of insulative material and connecting a selected overlapping portion of a conductive track to a selected terminal; and filling each hole at least partly with electrically conductive material such that the filled holes provide a plurality of electrical connections between the conductive tracks and the terminals.

Thus, the formation and subsequent filling of the plurality of holes at selected positions enables the performance of the electronic circuits to be configured or programmed. In other words, the interconnects or vias formed in the preformed multi-layer structure determine, at least partly, how the electronic devices are connected, which electronic devices are used and which are not, and hence the electronic properties of the resultant circuit.

In certain embodiments, the plurality of insulative features define a second plurality of electrical connections between the device terminals and in the layer of active material.

Thus, in addition to the interconnections between different areas of the active layer being provided out-of-plane by the conductive tracks and vias, at least some interconnections between the planar electronic devices can be provided by the material of the active layer itself.

Another aspect of the invention provides an electronic circuit manufactured using a method in accordance with the first or second aspect of the invention.

Another aspect of the present invention provides a method for use in the manufacture of an electronic circuit comprising at least one substantially planar electronic device, the method comprising:

forming a multi-layer structure comprising a layer of active material, a layer of insulative material (e.g. adjacent, immediately adjacent, and/or overlaying or underlaying the layer of active material), and at least a first hole extending from the active material through the layer of insulative material to a surface of the layer of insulative material, the layer of active material having a plurality of insulative features formed therein, each insulative feature at least partly inhibiting electrical current flow in the layer of active material and the plurality of insulative features defining at least a first substantially planar electronic device in the layer of active material, the first device comprising at least a respective first terminal and a respective second terminal, each terminal comprising a respective area of the layer of active material, and said first hole extending from one of the first and second terminals;

filling said first hole at least partly with electrically conductive material so as to provide a first electrical connection extending from one of the first and second terminals in a direction through the layer of insulative material; and forming a first conductive track in or on said surface of the layer of insulative material, said first conductive track being connected to the first electrical connection.

It will be appreciated that this method provides an alternative and complementary method to that provided by the first aspect of the invention, in that, rather than first forming a structure with the patterned active layer and at least one conductive track and then forming a selected via or vias, interconnection is achieved by first forming a multilayer structure with the patterned active layer and at least one selected hole to accommodate a respective via, and then filling the hole to form the selected via or vias and then forming the conductive track connected to the via.

In certain embodiments, the active layer may comprise a plurality of electronic devices, and a plurality of holes may be formed subsequent to filling to form an array of vias. Then, the circuit can be configured or programmed by making selected connections between the vias with one or more tracks formed at selected positions.

It will also be appreciated that optional features described above with respect to the first aspect can also be employed in embodiments of this third aspect of the invention with corresponding effect/advantage.

In certain embodiments, the structure comprises a second hole extending from a further area of the layer of active material through the layer of insulative material to said surface, the method further comprising filling said second hole at least partly with electrically conductive material so as to provide a second electrical connection extending from the further area in a direction through the layer of insulative material.

In certain embodiments, forming of the first conducting track comprises forming the first conductive track so as to connect first and second electrical connections.

In certain embodiments, the method further comprises selecting the first electrical connection,
and wherein said forming of the first conductive track comprises forming the first conductive track so as to be connected to the selected first electrical connection and not connected to the second electrical connection.

In certain embodiments, the further area is a terminal of a second substantially planar electronic device defined in the layer of active material by the insulative features.

Alternatively, in certain embodiments the further area is a terminal of the first device.

In certain embodiments, filling the or each hole comprises filling the or each hole fully with the electrically conductive material.

In certain embodiments, forming said structure comprises forming the or each hole using a technique from a list comprising: drilling (e.g. laser, mechanical, micro); masking and then etching; forming a depression and then etching; imprinting; ablation; chemical lift-off.

In certain embodiments, this forming of the first conductive track is performed after said filling of the or each hole.

Alternatively, in other embodiments this forming of the first conductive track is performed at the same time as the filling of the or each hole.

In certain embodiments, forming of the first conductive track is performed after the forming of the structure.

In certain embodiments, forming the first conductive track comprises depositing electrically conductive material on the surface. In certain embodiments this depositing comprises printing, and this printing may comprise printing an electrically conductive ink.

In certain embodiments, the forming of the first conductive track comprises filling, at least partly, a trench, groove, recess or depression formed in said surface with electrically conductive material.

In certain embodiments, said filling of the trench groove, recess or depression is performed at the same time as filling the or each hole.

In certain embodiments, the same electrically conductive material is used to fill the trench, groove, recess or depression and the or each hole.

In certain embodiments, the layer of insulative material is a first layer of insulative material and the multi-layer structure comprises a second layer of insulative material and at least one hole extending from a respective area of the layer of active material, through the second layer of insulative material to a surface of the second layer of insulative material, the method further comprising: filling that hole at least partly with electrically conductive material so as to provide a respective further electrical connection extending from the respective area of the layer of active material in a direction through the second layer of insulative material; and forming a further conductive track in or on said surface of the second layer of insulative material and connected to the further electrical connection.

Thus, the method may be used to form a structure comprising an active layer with electronic devices defined therein, and a plurality of conductive track layers, interconnected to the active layer by respective vias. These conductive track layers may be formed on the same side as the active layer, or on opposite sides, providing greater flexibility and the ability to form a greater number of interconnections between devices than is possible with a single layer of connecting tracks.

Another aspect of the present invention provides a method of manufacturing an electronic circuit comprising a plurality of substantially planar electronic devices, the method comprising:
  forming a multi-layer structure comprising a layer of active material, a layer of insulative material, and a plurality of holes extending from the active material through the layer of insulative material to a surface of the layer of insulative material, the layer of active material having a plurality of insulative features formed therein, each insulative feature at least partly inhibiting electrical current flow in the layer of active material and the plurality of insulative features defining a plurality of substantially planar electronic device in the layer of active material, each device comprising at least a respective first terminal and a respective second terminal, each terminal comprising a respective area of the layer of active material, and each hole extending from one of the first and second terminals of a respective device;
  filling each said hole at least partly with electrically conductive material so as to provide a respective electrical connection (a respective via) extending from a respective terminal in a direction through the layer of insulative material; and
  forming a plurality of conductive tracks in or on said surface of the layer of insulative material to form a plurality of connections between said electrical connections (vias).

In certain embodiments, the method further comprises selecting a subset of the plurality of electrical connections (vias),
  wherein said forming of a plurality of conductive tracks comprises forming the plurality of conductive tracks to form connections only to the subset, and not to the remaining electrical connections (vias).

In certain embodiments, the plurality of electrical connections (vias) are connectable in a plurality of different configurations, and said forming of the plurality of conductive tracks is arranged to connect the electrical connections (vias) in a selected one of said plurality of configurations.

In certain embodiments, the plurality of insulative features define a second plurality of electrical connections between the device terminals and in the layer of active material.

Another aspect of the invention provides an electronic circuit manufactured using a method in accordance with any of the above-mentioned aspects of the invention.

BRIEF DESCRIPTION OF THE DRAWINGS

Embodiments of the invention will now be described with reference to the accompanying figures, of which.

DESCRIPTION OF THE EMBODIMENTS OF THE INVENTION

Figure 1:
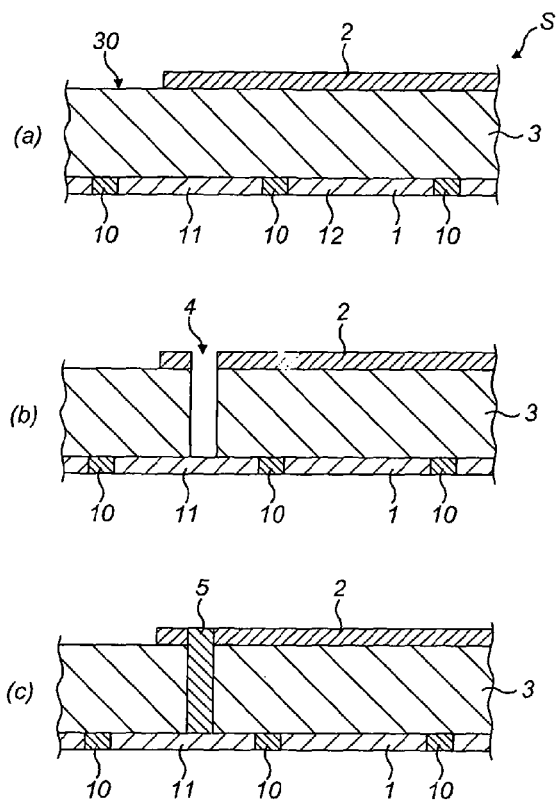
FIGS. 1a-1c illustrate steps in a method embodying the invention.

Referring now to FIGS. 1a-1c, one method embodying the invention comprises first forming a multilayer structure S, the structure comprising a layer of electronically active material 1 (in this example semiconductive material), the layer 3 of insulative material formed over the active layer 1, and at least one conductive track 2, formed on a surface 30 of the insulative layer 3 and extending in a plane generally parallel to the active layer 1. A plurality of insulative features 10 are formed in the layer of active material 1, each insulative feature at least partly inhibiting electrical current flow in the layer of active material. The plurality of insulative features 10 define at least a first electronic device in the layer of active material 1, that first electronic device being planar, and comprising a first terminal and a second terminal, these terminals being provided by respective areas 11, 12 of the layer of active material 1. A wide variety of means may be employed to form the insulative features 10. Suitable techniques are disclosed, for example, in the present Applicant's published and/or co-pending patent applications WO02/086973A2, WO2006/008467A1, WO2006/120414A2, GB0819684.2, GB0814028.7, GB0901389.7, GB0915250.5, and GB0905310.9, the contents of each of which are incorporated herein by reference. Having started by providing the multilayer structure S shown in FIG. 1a, the method continues by then forming a hole 4 which extends between the conductive track 2 of a portion 11 of the active material providing the first terminal of the electronic device. The hole 4 extends through the layer of insulative material 3 and connects the material of the conductive track 2 to the portion 11 of the active layer. Next, as illustrated in FIG. 1c, hole 4 is completely filled in this example with electrically conductive material so as to provide an electrical connection 5 (which may also be referred to as a via) between the conductive track 2 and the first terminal 11. It will be appreciated that this example, and other embodiments, the positioning of the hole 4 determines which conductive track 2 is connected to which portion of the patterned active layer 1.

In the embodiment shown in FIGS. 1a-1c, the hole 4 formed to connect the conductive track 2 to a portion of the underlying layer of active material was formed so as to pass completely through the track 2, completely through the layer 3 of insulative material, and terminated at a surface of the active layer. However, holes having different structures and configurations may also be employed (or may alternatively be employed) in certain embodiments of the invention. FIGS. 2 and 3 illustrate a variety of such holes. In methods embodying the invention, just one of these hole types may be incorporated, or alternatively a variety of these hole types may be formed in the same structure. The particular configuration of holes used, and the particular combination of types of holes, if appropriate, will be determined by the requirements of the particular application. In FIG. 2, the first hole 4a has been formed from the surface 20 of the conductive track 2, and extends to the track 2, and through the insulative layer 3 to terminate at an upper surface of the layer of active material 1. A second type of hole 4b has been formed from the upper side of the structure, entering through a surface of the active layer, passing completely through the active layer and insulative layer 3, and terminating at a nominal lower surface 21 of the conductive track 2. Another hole 4c, has been formed from the conductive track side of the structure, but this time extends completely through the track 2 and insulative layer 3 and also extends partly into the active layer 1. Another hole 4d has been formed through the structure from the active layer side, and this time extends partly into the conductive track material. The final hole 4e has been formed so as to pass completely through the structure. Each of these hole types finds application in certain embodiments of the invention.

Referring now to FIG. 3, a further hole type 4f has been formed by laser drilling on the conductive track side of the structure. It has a generally conical shape, and extends completely through the structure. The tapering nature of this conical hole facilitates the filling of the hole with electrically conductive material to form the electrical connection between the active layer material 1 and conductive track 2. Another hole shaped to facilitate drilling is hole 4g. This hole comprises a generally cylindrical portion extending down to meet the layer of active material 1, but an upper portion of the hole tapers outwardly, ending at the upper surface 20 of the conductive track 2. Finally, another hole shape is that of hole 4h, which comprises a relatively narrow portion and a relatively wide portion at the conductive track end of the hole. Again, this structure facilitates filling of the hole 4h with electrically conductive material in a subsequent step of the method embodying the invention.

Figure 4:
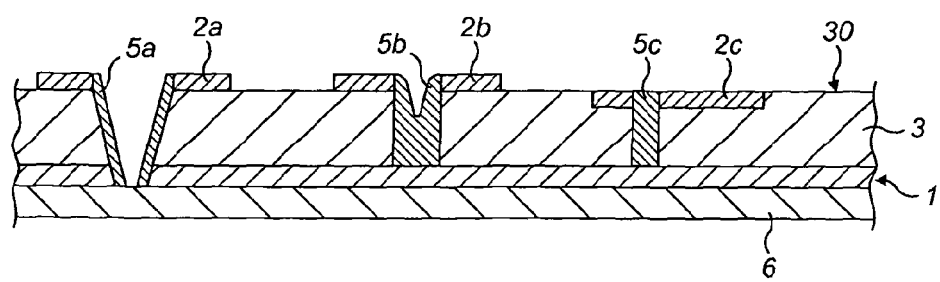
FIG. 4 is a schematic representation with a variety of electrical connections which may be used in methods embodying the invention to connect connective tracks to a layer of active material.

Referring now to FIG. 4, this illustrates a variety of electrical connections 5 formed in holes formed in multilayer structures in methods embodying the invention. Again, each type of electrical connection may be employed on its own in certain embodiments of the invention, or in combination with one or more other types to suit requirements. A first electrical connection 5a takes the form of a conductive coating formed on the inside surface of a generally conical hole formed through the structure. This coating connects the material of the active layer 1 to the conductive material of a first conductive track 2a which has been formed on an upper surface 30 of the insulative layer. It will be appreciated that this electrical connection 5a does not completely fill the corresponding conical hole, but nevertheless provides an electrical connection between the conductive track 2a and the active layer 1. A second electrical connection 5b has been formed by partially filling a generally cylindrical hole that has been formed so as to extend through a conductive track 2b, down through the insulative layer 3, and terminating at a surface of the active layer 1. (This is in contrast to the conical hole housing the electrical connection 5a, which extended completely through the active layer, down to a surface of an underlying, supporting substrate 6). Again, although the electrically conductive material of connection 5b only partially fills the corresponding hole, it provides electrical connection between the track 2b and the active layer. A third electrical connection 5c has been formed by completely filling a generally cylindrical hole with conductive material, that hole passing through a conductive track 2c formed in a recess in the surface 30 of the insulative layer, and extending down through the insulative layer 3 to terminate at the layer of active material 1.

Figure 5:
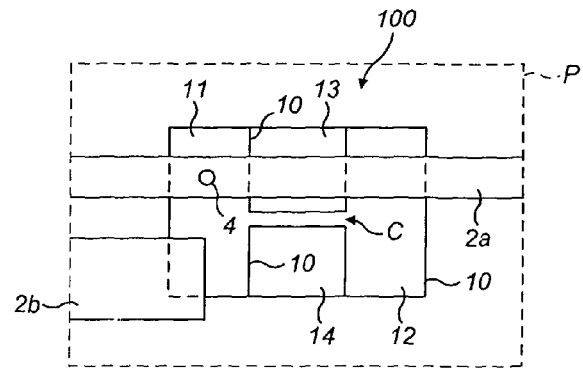
FIG. 5 is a schematic plan view of parts of an electronic circuit embodying the invention and produced using a method embodying the invention.

Referring now to FIG. 5, this shows a portion P of an electronic circuit manufactured using a method embodying the invention. It will be appreciated that FIG. 5 is highly schematic, and this schematic plan view is merely intended to show the relative positioning of the conductive tracks and underlying features in the layer of active material. The illustrated portion P of the device includes a substantially planar electronic device 100 defined by a plurality of insulative features 10 formed so as to interrupt the layer of active material. It will be appreciated that these insulative features 10 may be formed using a wide variety of techniques, for example those disclosed in the Applicant's published and/or co-pending patent applications WO02/086973A2, WO2006/008467A1, WO2006/120414A2, GB0819684.2, GB0814028.7, GB0901389.7, GB0915250.5, and GB0905310.9. In this particular example the electronic device 100 is a side-gated transistor, having a source terminal 11 connected to a drain terminal 12 by a narrow channel C of semiconductive material defined by insulative features 10 which also define first and second gate terminals 13, 14 on either side of the channel C, that is in the same plane as the channel. A first conductive track 2a has been formed, such that track 2a passes over (i.e.

overlaps) the first, second, and third terminals (11, 12 and 13 respectively) of the FET 100. Another conductive track 2b has been formed, which overlaps just the first terminal 11 of the device 100. It will be appreciated that a method embodying the invention could be used to make selected connections between track 2a and any one of the first, second and third terminals of the device, and between the conductive track 2b and the first terminal 11. However, in this embodiment, a single hole 4 has been formed so as to connect the track 2a to the first terminal 11. The hole 4 may then be filled to form the "vertical" electrical connection between the track 2a and first terminal 11 (this vertical connection may also be referred to as a via, formed at a selected position so as to connect a selected track to a selected terminal (area of the active layer)).

Figure 6:
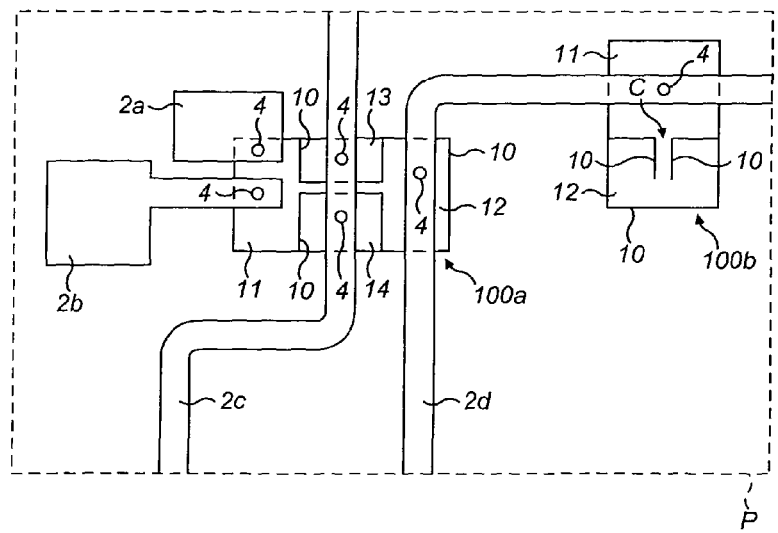
FIG. 6 is a schematic plan view of a portion of another electronic circuit embodying the invention and manufactured using a method also embodying the invention.

Referring now to FIG. 6, this is another highly schematic plan view of part of an electronic circuit embodying the invention. Again, its purpose is to show the relative positions of the plurality of conductive tracks relative to the features of the underlying patterned active layer. This portion P of the circuit includes a side-gated transistor 100a and a planar self-switching device (or diode) 100b. The operation of the diode 100b, and suitable methods for forming it will be apparent from published and/or co-pending patent applications WO02/086973A2, WO2006/008467A1, WO2006/120414A2, GB0819684.2, GB0814028.7, GB0901389.7, GB0915250.5, and GB0905310.9 in the name of the present Applicant. A plurality of conductive tracks 2a, 2b, 2c and 2d have been formed as part of the structure, overlapping the electronic devices at various positions. For example, a first conductive track (which may also be referred to as a conductive pad) 2a overlaps a first terminal area 11 of the FET 100a. A hole 4 has been formed to connect track 2a to portion 11 of active material. Similarly, another conductive track 2b overlaps the first terminal 11 of device 100a, and is linked to it by another hole 4. This conductive track 2b has a relatively narrow portion which extends over the first terminal 11, and a relatively wide portion distal the first terminal 11, for facilitating additional contacts to the track 2b. It will be appreciated that suitable input and/or output connections may be made to the relatively large contact areas of tracks 2b and 2b. Another track 2c overlaps both the third and fourth terminals 13, 14 of FET 100a (that is it overlaps both these side-gate terminals). Track 2c is linked to both of these side-gates by suitably formed holes 4. A fourth conductive track 2d overlaps both the second terminal 12 (i.e. drain) of FET 100a and a first terminal 11 of diode 100b. Further holes 4 link track 2d to these terminals of the two different devices. It will be appreciated that a single "in-fill" step may be used to at least partly fill all of the holes 4 with electrically conductive material in the arrangement shown in FIG. 6, so as to provide electrical connections between the respective tracks and the selected underlying portions of active material.

Figure 2:
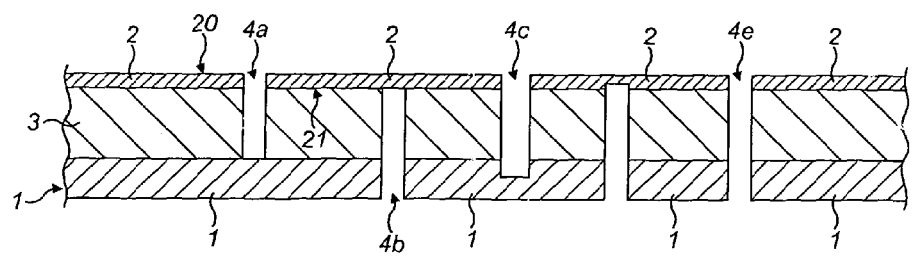
FIGS. 2 and 3 are schematic representations with a variety of holes connecting conductive tracks to a layer of active material which may be formed (i.e. utilised) in methods embodying the invention.
Figure 3:
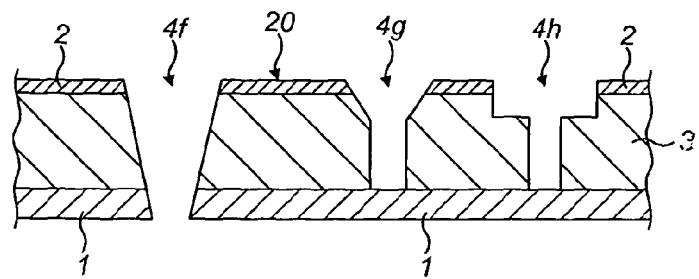

It will be appreciated that the structures shown in FIGS. 1-3 may be produced using a technique in which a pattern of one or more conductive tracks 2 is deposited on a surface of the insulative layer 3, for example by printing. Such techniques provide the advantage of being compatible with high volume, fast throughput processing.

Figure 7:
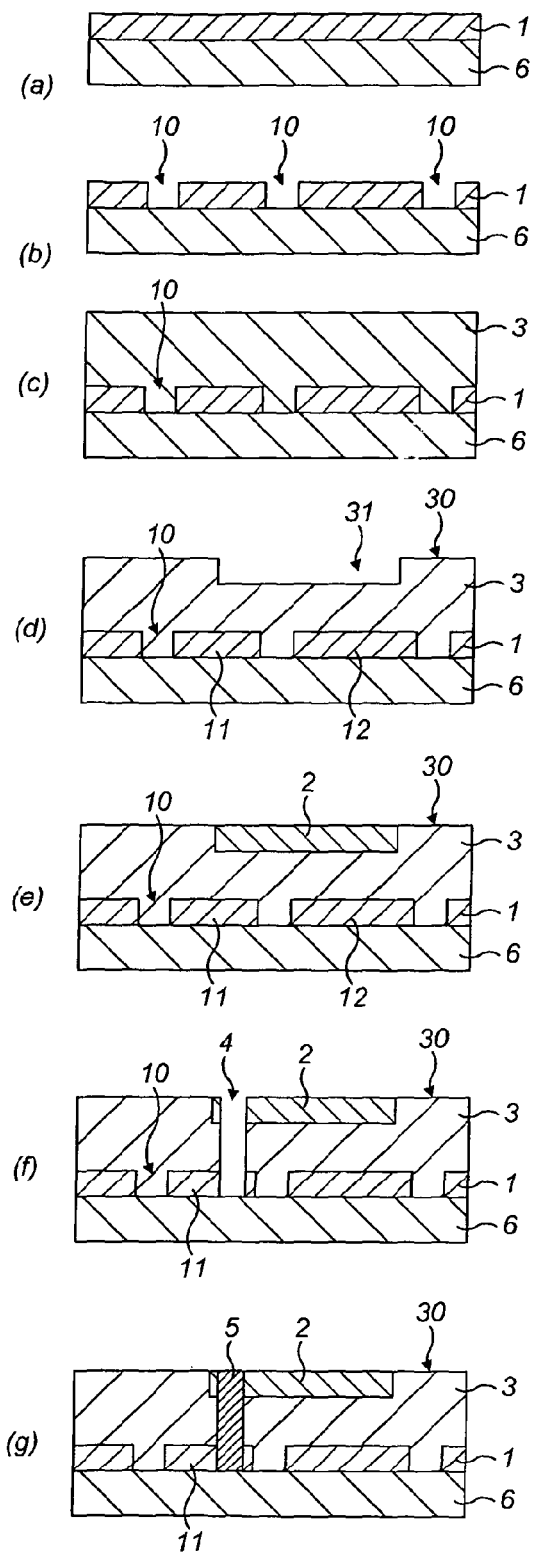
FIGS. 7a-7g illustrate steps in another method embodying the invention.

Referring now to FIG. 7, this shows a method embodying the invention in which one or more conductive tracks is formed using a different technique. FIG. 7a shows an early stage in the process in which an unpatterned layer of active material 1 has been formed over a supporting substrate 6. Next, as shown in FIG. 7b, a pattern of insulative features 10 in the form of trenches interrupting the layer of active material 1 are formed, each trench extending through the active layer to the underlying substrate 6. Next, a layer of insulative material 3 is formed over the supported active layer (that has been patterned with trenches), the insulative material filling each of these trenches. Thus, in the arrangement shown in FIG. 7c, each insulative feature 10 is now a trench or other interruption in the active layer 1, filled with insulative material. Next, a depression, recess, groove, trench or other equivalent structure 31 is formed in the surface 30 of the layer of insulative material 3. In other words, this trench, depression etc is formed so as to extend down, into the layer of insulative material 3, from the "upper" surface 30. This depression 31 has been arranged so as to overlap at least two portions 11, 12 of the patterned active layer 1, as shown in FIG. 7d. Next, the depression 31 has been filled with electrically conductive material so as to form a conductive track 2, extending in a plane generally parallel to the layer of active material 1, and separated from that active material by the insulative material 3. This is shown in FIG. 7e. Next, a hole 4 has been formed partly through the structure (terminating at the supporting substrate 6) at a position selected so that it connects (i.e. links) the conductive track 2 and the first portion 11 of the patterned layer of active material 1, as shown in FIG. 7f. Finally, as shown in FIG. 7g, hole 4 has been completely filled with electrically conductive material so as to provide a vertical electrical connection or via 5 between the conductive track and the first portion 11 of active material.

Figure 8:
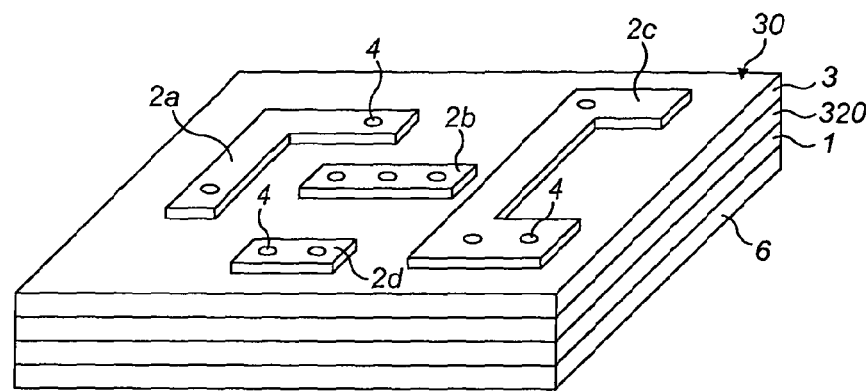
FIG. 8 is a schematic perspective view of part of another electronic circuit manufactured in accordance with the present invention.

Referring now to FIG. 8, this is a highly schematic perspective view of part of another electronic circuit embodying the invention. In this example, the multi-layer structure comprises a supporting substrate 6, on which a layer of active material 1 has been formed, that active layer being provided with a pattern of insulative features so as to define a plurality of substantially planar electronic devices in the layer 1. Above the layer of active material have been formed first and second layers of insulative material (3 and 320 respectively). A plurality of conductive tracks 2a-2d have been formed on an upper surface 30 of the first insulative layer 3 by suitable techniques. One such technique is printing, although other selective deposition techniques may also be used in alternative embodiments. An alternative technique is to cover the entire surface 30 with conductive material, and then selectively remove conductive material to leave just the illustrated tracks 2a-2d. It will be appreciated that a wide variety of additive and subtractive techniques may be utilised in different embodiments of the invention to achieve a desired pattern of conductive tracks. The figure also shows a plurality of holes 4 formed through the conductive tracks, and extending down through both insulative layers to respective portions of the layer of active material 1. In this example, although not apparent from the figure, each of these holes has been filled with electrically conductive material to form a respective "vertical" electrical connection or via between the conductive tracks and the underlying active layer 1.

Figure 9:
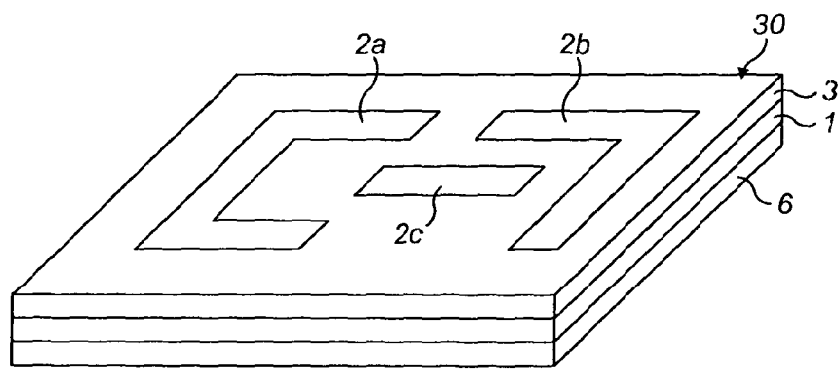
FIG. 9 is a schematic perspective view of another electronic circuit manufactured in accordance with the present invention.

Referring now to FIG. 9, this shows an alternative structure formed using a technique embodying the invention, in which an underlying and supporting substrate 6 supports a single layer of active material 1, having a single layer of insulative material 3 formed above it. A plurality of tracks 2a-2c have been formed in the surface 30 of the layer of insulative material 3. In other words, the "upper" surfaces of each of the conductive tracks 2a-2c is substantially level with the surface 30, each track having been formed by filling an appropriately arranged recess, depression etc formed in the insulative layer 3. Although not shown in the figure, vias may be selectively formed after formation of the conductive tracks 2a-2c by forming and then filling holes down to the active layer 1. Alternatively, in other embodiments the holes may be formed before filling the respective trenches, depressions etc to form the conductive tracks, so that the tracks and vias may be formed at the same time, by filling the holes and depressions with suitable electrically conductive material.

Figure 10:
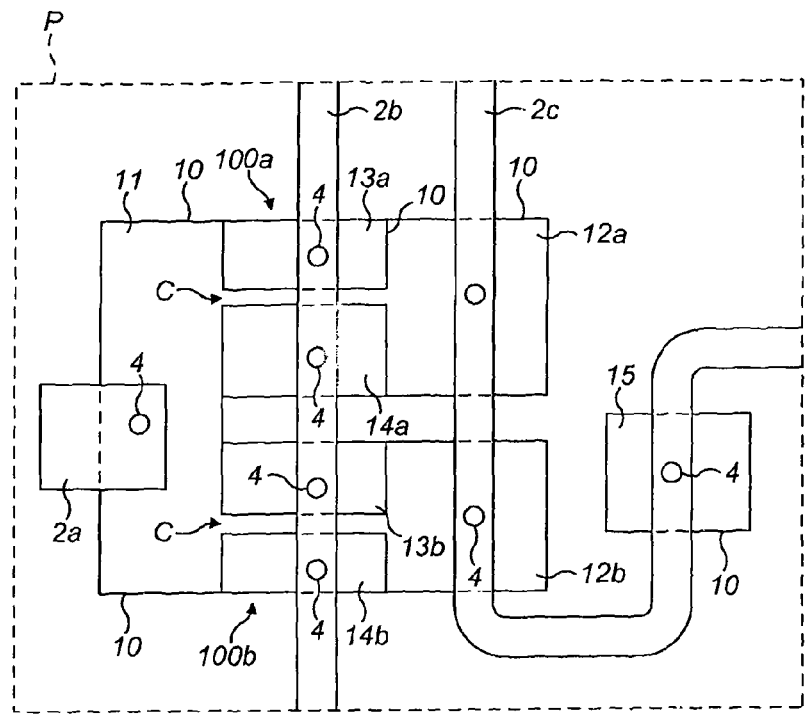
FIG. 10 is a schematic plan view of part of another electronic circuit embodying the invention and produced using a method in accordance with the present invention.

Referring now to FIG. 10, this is another highly schematic representation of components of part of another electronic circuit embodying the invention and manufactured using a method embodying the invention. A plurality of insulative features 10 have been formed in a layer of active material so as to define first and second side-gated transistors 100a and 100b, and a further isolated area of active material 15. The side-gated transistors 100a, 100b have a common source provided by an area 11 of the layer of active material. Thus, this portion 11 of active material provides both the source terminal of each side-gated transistor and the electrical connection between those sources. Each transistor comprises a respective drain terminal 12a, 12b and respective gate terminals 13a, 14a, 13b, 14b on either side of a respective conductive channel C. A first conductive track 2a overlaps the common source area 11, and is connected to it by a respective hole 4, filled with conductive material. Another track 2b overlaps each of the gate terminals, and is linked to each of these gate terminals by a respective filled hole. Thus, the conductive track 2b electrically ties all of the gate terminals together. Thus, a single potential can be applied to all four of the gate terminals at the same time by simply applying that potential to the conductive track 2b. Another conductive track 2c overlaps the drain terminals 12a, 12b of each of the transistors and also the further area 15 of active material. This track 2c is connected to those drain terminals and the further area 15 by means of respective filled holes. Thus, it will be appreciated from the above description of FIG. 10 that the electronic circuit includes both connections between devices provided within the layer of active material itself, and electrical connections between device terminals and between device terminals and other areas of active material by means of tracks provided over the layer of active material and connected to it by a plurality of wires (i.e. vertical electrical connections at selected positions).

Figure 11:
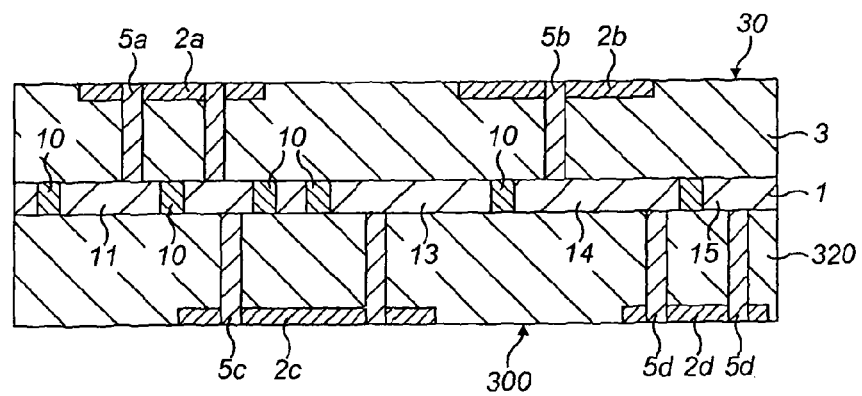
FIGS. 11-13 are schematic cross sections of structures comprising layers of active material, conductive tracks and electrical interconnections between the active layer and tracks embodying the invention and produced using methods in accordance with the present invention.

Referring now to FIG. 11, this shows an alternative structure produced using a method embodying the invention. The structure comprises a single layer of active material 1, in which a plurality of insulative features 10 have been formed to define a plurality of electronic devices. These insulative features define a plurality of different areas of the layer of active material, those different areas being labelled 11, 12, 13, 14, and 15 in the figure. A first layer of insulative material 3 has been formed above the active layer, and a first plurality of conductive tracks 2a, 2b have been formed in a surface 30 of that layer 3. A first plurality of "vertical" electrical connections 5a, 5b have been formed to connect those conductive tracks 2a, 2b to respective portions of the active layer. Each of these vertical connections 5a, 5b has been formed by forming and then filling a respective hole extending through the first insulative layer 3. The structure comprises a second layer of insulative material 320, and a second plurality of conductive tracks 2c, 2d formed in a surface 300 of that second insulative layer 320. A second plurality of vertical electrical connections 5c, 5d have been formed to connect the second plurality of conductive tracks 2c, 2d to respective portions of the patterned active layer 1. Thus, the structure comprises respective pluralities of conductive tracks formed on either side of the layer of active material. An advantage of this arrangement is that, by providing layers of interconnections on both sides of the active layer, a greater number of interconnections between different portions of the active layer are possible than would be the case with a single layer of connecting tracks.

Figure 12:
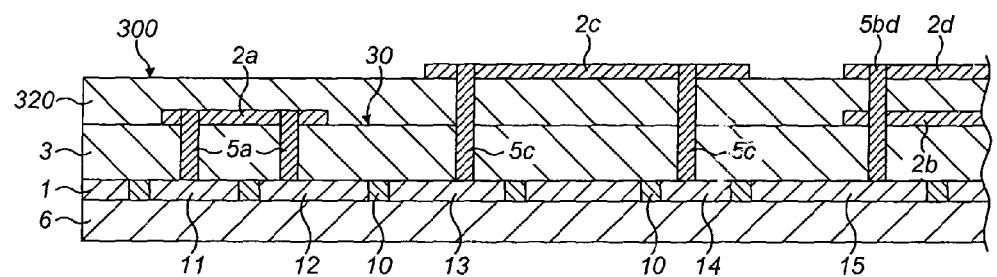

Moving on to FIG. 12, this shows another structure formed using methods embodying the invention. Again, the structure comprises a single layer of active material, provided with a plurality of insulative features 10, defining a plurality of different regions of active material 11, 12, 13, 14 and 15, e.g. terminals of one or more planar electronic devices in the layer 1. The layer of active material is supported by a substrate 6. A first layer of insulative material 3 is formed over the active layer, and a plurality of conductive tracks 2a, 2b are formed on a surface 30 of this layer, each connected to one or more underlying portions of the active layer by a respective vertical connection 5a, 5bd. After forming this first plurality of conductive tracks, a second layer 320 of insulative material has been formed on the structure, and a second plurality of conductive tracks 2c, 2d has been formed on a surface 300 of this second layer 320. A second plurality of electrical connections has been formed to connect this second plurality of tracks to respective portions of the active layer 1. As can be seen, electrical connections or vias 5a connect first and second portions of the active layer by means of track 2a, and electrical vias 5C connect portions 13 and 14 of the active layer by means of track 2c. Electrical via 5bd has been formed so as to pass through and link together tracks 2d and 2b provided at different levels in the structure, and furthermore connects those tracks to portion 15 of the active layer.

Figure 13:
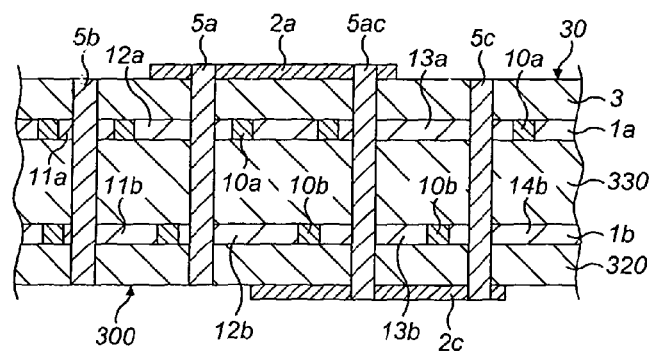

FIG. 13 shows yet another structure produced using methods embodying the invention. This structure comprises a first patterned layer of active material 1a, and a second patterned layer of active material 1b. Each of these layers of active material is provided with a respective plurality of insulative features 10a, 10b, which define a plurality of electronic devices in each of the layers. A first layer of insulative material 3 is provided on a first side of the first active layer 1a, a second insulative layer is provided on a second side of the second active layer 1b, and a third layer of insulative material 330 is provided which separates the first and second patterned layers of active material 1a, 1b. A plurality of conductive tracks have been formed on a surface 30 of the first layer of insulative material 3, although just one of these tracks 2a is shown. Similarly, a second plurality of conductive tracks have been formed on a surface 300 of the second layer of insulative material 320, with again just one of these tracks, 2c, being shown. In order to provide electrical connections (vias) a plurality of holes have been formed at selected positions through the entire structure, and each of these holes has been completely filled with conductive material in this example. A first filled hole 5b provides an electrical connection between portions 11a and 11b of active material, a second filled hole 5a provides an electrical connection between track 2a, portion 12a, and portion 12b. Another filled hole 5ac provides a connection between track 2a, portion 13a, portion 13b, and track 2c, and a final filled hole 5c provides an electrical connection between portion 13a, portion 14b, and track 2c. Thus, these filled holes which extend completely through the structure can provide electrical connections just between selected portions of the two layers of active material, or between one or more selected portions of the two active layers and one or more of the selected tracks on either side of the structure. Again, the positions of the holes, which are then filled, can be selected to choose how the various regions are interconnected.

Figure 14:
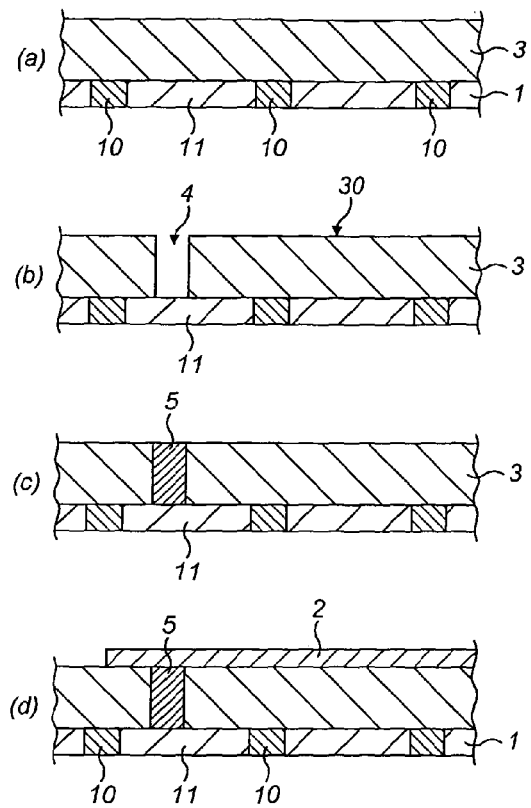
FIGS. 14a-14d illustrate steps in another method embodying the present invention.

Referring now to FIG. 14, this illustrates steps in another method embodying the present invention. The method comprises forming a multi-layer structure comprising a layer of active material 1 and a layer of insulative material 3 adjacent, overlaying, or underlaying the layer of active material 1. In this particular example, the active layer 1 and insulative layer 3 are in direct contact with one another, as shown in FIG. 14a. The active layer 1 has been formed so that it is patterned with a plurality of insulative features 10, each of which at least partly interrupts the active material so as to at least inhibit electrical current flow in the layer. The plurality of insulative features 10 define at least one substantially planar electronic device in a layer of active material. The method also comprises forming a hole 4 in the structure, extending from a surface 30 of the insulative layer 3 down to the active layer 1, such that the hole links through to a selected portion 11 of the active layer 1. It will be appreciated that a variety of techniques may be used to form this hole, for example etching, imprinting and etching, drilling etc. Next, as shown in FIG. 14c, an electrical connection 5 extending from the portion 11 of active material up to the surface 30 of the insulative layer 3 is formed by filling the hole 4 with electrically conductive material. Electrical connection 5 can be regarded as a vertical connection or via, to which electrical connection can be made by one or more conductive tracks formed on a surface 30 of the layer 3. In the final step, shown in FIG. 14d, one such conductive track 2 has been formed by depositing electrically conductive material on the surface 30 of the insulative layer, that conductive track 2 making electrical connection to the via 5. Thus, in this method the electrical via, which extends from the active layer at least partly through the structure, is formed first, and then the conductive track is formed to connect to the via.

Figure 15:
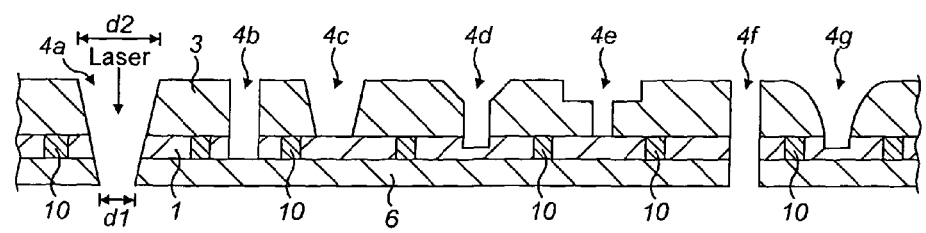
FIG. 15 is a schematic illustration of a variety of holes which may be formed in multilayer structures in embodiments of the invention.

Referring now to FIG. 15, a variety of types and configurations of holes may be formed in the multi-layer structure in embodiments of the invention, to be then filled with conductive material to form a vertical electrical connection or via to which one or more conductive tracks can then be contacted. FIG. 15 illustrates a variety of these holes, which may be employed singly, or in combination in embodiments of the invention.

Hole 4a is a substantially conical hole that has been formed by laser drilling through the structure which comprises a supporting substrate 6, the layer of active material 1, and an overlaying insulative layer 3. The laser used to perform this drilling has been directed at the structure from the insulative layer 3 side, and the conical hole produced has a larger entrance diameter d2 than its exit diameter d1 at the lower side of the structure. A second hole 4b has been formed so as to not extend completely through the structure, instead penetrating through the insulative layer 3 and active layer 1, but terminating at a surface of the supporting substrate 6. Hole 4c is an alternative hole, which again is substantially conical in shape, this time terminating at a surface of the active layer. Hole 4d is another hole which may be formed in embodiments of the invention, having a generally cylindrical portion which extends partly down into the active layer 10, and which has a tapered portion extending out from the cylindrical portion to the upper surface of the insulative layer 3. Hole 4e is an alternative hole, having a substantially cylindrical portion and a wider portion at its mouth at the surface of the insulative layer. Hole 4f is another hole, this time being substantially cylindrical and extending completely through the structure. Lastly, hole 4g has a substantially tapered profile, again being formed by laser drilling, and extending completely through the insulative layer 3 and partly into the active layer 10. Although FIG. 15 shows this variety of hole shapes and configurations, it will be appreciated that yet further types of configurations of holes may be formed and used in embodiments of the invention.

Figure 16:
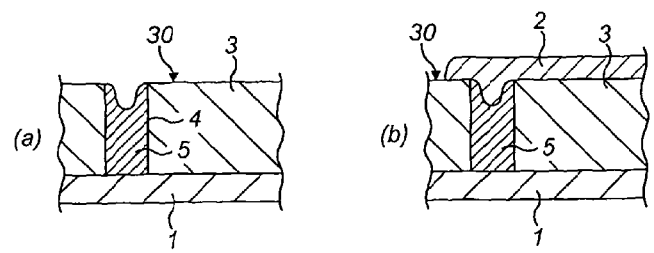
FIG. 16a is a schematic representation of an electrical connection formed in a method embodying the invention and FIG. 16b is a schematic representation of a conductive track formed on the structure of FIG. 16a to form a connection to the electrical connection extending down to the layer of active material in the structure.

Referring now to FIG. 16a and b, these show certain steps in a method embodying the invention. In FIG. 16a, a hole formed through the insulative layer 3 has been partly filled with conductive material to form a vertical connection or via 5. In FIG. 16b, a conductive track 2 has been formed on a surface 30 of the insulative layer 3, and this conductive track extends partly into the hole so as to make electrical connection with the via 5. It will be appreciated that a wide variety of techniques may be used to form the conductive track 2, for example deposition techniques such as selected printing, conductive layer formation and selected removal (or lift off), masking and printing, etc.

Figure 17:
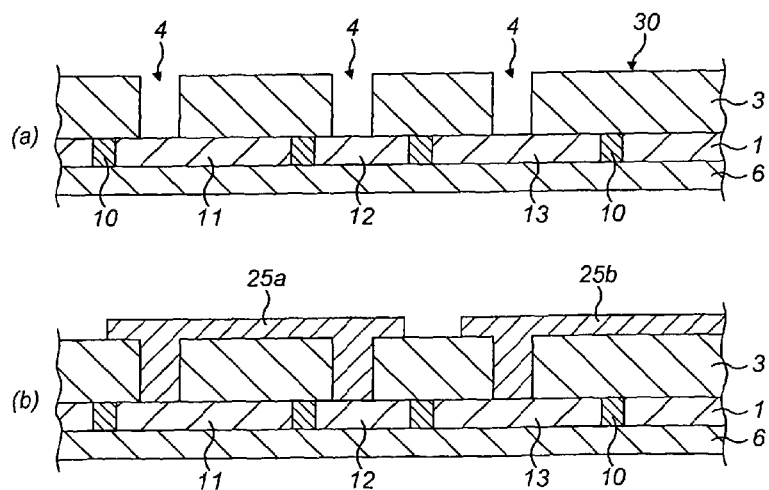
FIGS. 17a and b illustrate steps in another method embodying the invention.

Referring now to FIGS. 17a and b, these show steps in an alternative method embodying the invention. FIG. 17a shows how a multi-layer structure comprising a layer of insulative material 3, a patterned layer of active material 1 (e.g. semiconductive material), and a supporting substrate 6 has been formed. A plurality of holes 4 have been formed through the insulative layer 3, each hole extending down to a respective region or area 11, 12, 13 of the layer of active material 1. Then, in a single step, as shown in FIG. 17b, bodies of electrically conductive material 25a and 25b have been formed, each one of these bodies providing one or more respective electrical connections or vias down to the active layer and a respective conductive track on the surface 30 of the insulative layer 3. In other words, the conductive tracks and vertical electrical connections have been formed at the same time. These bodies 25a, 25b of electrically conductive material may be formed by a variety of techniques, for example by selective masking of the upper surface 30 of the layer 3 and then depositing a conductive ink, for example by printing. Alternatively, the entire upper surface 30 of the insulative layer 3 may be covered with conductive material, at the same time as filling each hole 4, and then selected tracks can be formed in the structure by suitable selective removal of conductive material from the upper surface 30.

Figure 18:
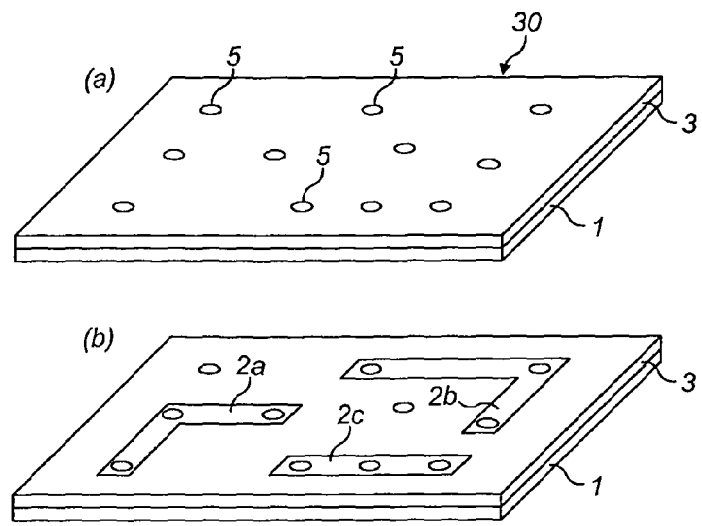
FIGS. 18a and b illustrate steps in another method embodying the invention.

Referring now to FIG. 18, this shows, in a highly schematic form, part of a structure formed during a method embodying the invention. The structure comprises a patterned layer of active material 1 (i.e. including a plurality of insulative features, defining a plurality of planar electronic devices in the layer 1). A layer of insulative material 3 has been formed over the layer of active material 1, and a plurality of electrically conductive vias 5 have been formed at selected positions on the structure, each via extending from the upper surface 30 of the layer 3 down to a respective portion of the active layer 1. Next, and as illustrated in FIG. 18b, a plurality of conductive tracks 2a, 2b, 2c have been formed on the surface 30, each track connecting together a selected plurality of vias 5. It will be appreciated that electrical connections (by means of the tracks) have not been formed to all of the vias 5, in this particular example, the electronic devices in the underlying active layer 1 could be connected in a plurality of configurations to give a plurality of different circuit performances, and the pattern of conductive tracks 2a-2c formed on the surface 30 is selected to achieve a particular circuit configuration. In other words the particular pattern of conductive tracks 2a-2c used to connect together selected ones of the pre-formed vias 5 is arranged to program or configure the electronic circuit formed from the devices provided in the active layer 1.

Figure 19:
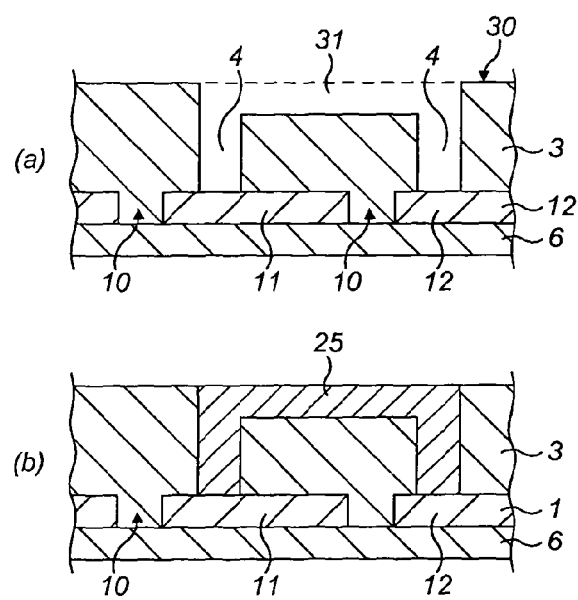
FIGS. 19a and b illustrate the formation of an electrical connection between two areas of active material in an embodiment of the invention.

Referring now to FIG. 19, in contrast to embodiments in which conductive tracks are formed on the surface 30 of the insulative layer 3, FIGS. 19a and b illustrate part of the method embodying the invention in which one or more conductive tracks may be formed in a surface of the insulative layer 3, at the same time as the vertical vias are formed. FIG. 19a illustrates the structure at a position part way through the method embodying the invention, in which a plurality of holes 4 have been formed through the insulative layer 3, down to respective portions of the active layer 1. Additionally, a trench or recess 31 has been formed in the upper surface 30 of the insulative layer 3, that trench or recess 31 connecting these vertical holes 4. FIG. 19b shows a structure at a later stage in the method, where the holes 4 and recess or trench 31 have been filled in a single step (i.e. they have been filled substantially at the same time) with electrically conductive material so as to form an interconnection between portions 11 and 12 of the active layer, which were otherwise separated by insulative features 10.

Figure 20:
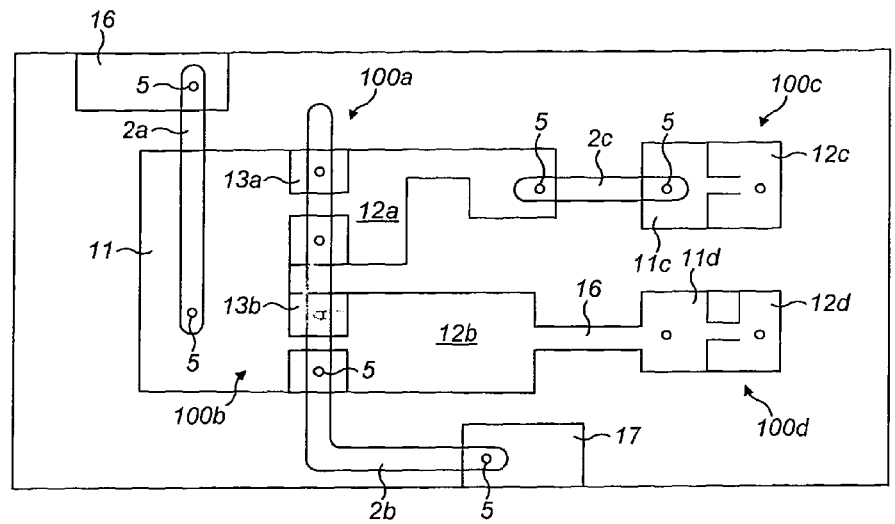
FIG. 20 is a schematic plan view of part of the circuit embodying the invention and produced using methods embodying the invention.

Referring now to FIG. 20, this is a highly schematic plan view of certain components of an electronic circuit embodying the present invention. A layer of active material has been patterned with insulative features 10 to define a first side-gated transistor 100a, a second side-gated transistor 100b, a first diode (or self-switching device) 100c, and a further electronic device 100d, which has a single side gate, and also exhibits a degree of self-switching behaviour as a result of the asymmetrical arrangement of the insulative features with respect to terminals 11d and 12d which are connected by a conductive channel C. A first plurality of interconnections between the various devices are provided in the layer of active material itself. For example, a portion 11 of the layer of active material provides both the source terminals of the transistors 100a, and 100b and the interconnection between them. A further portion 16 of the layer of active material provides a connection between the drain terminal 12b of device 100b and a first terminal 11d of the fourth device 100d. A second plurality of interconnections between the various devices are provided by conductive tracks formed over the active layer, and connected through to it by means of electrical vias 5 formed using techniques as described above. For example, a first conductive track 12a is formed to connect to pre-formed vias 5 which themselves connect down to a further portion 16 of the layer of active material and the source region 11 of the first and second side-gated transistors. A second conductive track 2b is formed so as to tie together (i.e. connect) vias 5 connected down to each of the side gates of the devices 100a and 100b, and also to connect to a via 5 which is itself connected down to another region 17 of the active layer. A third conductive track 2c has been formed so as to connect together pre-formed vias connected to drain terminal 12a of device 100a and first terminal 11c of diode 100c.

Figure 21:
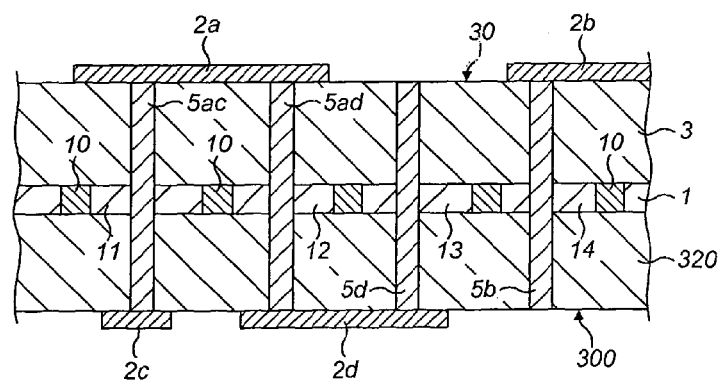
FIGS. 21-24 are schematic cross sections of a variety of structures produced using methods embodying the invention.

Referring now to FIG. 21, this shows an alternative structure produced using a method embodying the invention. This structure comprises a patterned layer of active material 1, provided with a plurality of insulative features 10 defining a plurality of regions 11, 12, 13 and 14 of active material. The structure comprises a first layer of insulative material 3 formed on the first side of the active layer 1, and a second insulative layer 320 formed on a second side of the active layer 1. A plurality of holes have been formed completely through the two insulative layers and active layer, and each of these holes has been filled with electrically conductive material to form a respective electrical connection (vertical connection, or via) extending from a surface 30 of the first insulative layer 3 to a surface 300 of the second insulative layer 320. After forming these vias, the vias have then been selectively connected by means of first and second pluralities of conductive tracks 2a, 2b and 2c, 2d respectively formed on opposite sides of the structure. As with previous embodiments, this arrangement of conductive tracks on either side of the structure provides the advantage that a greater number of interconnections is possible than with a single layer of interconnecting conductive tracks.

Figure 22:
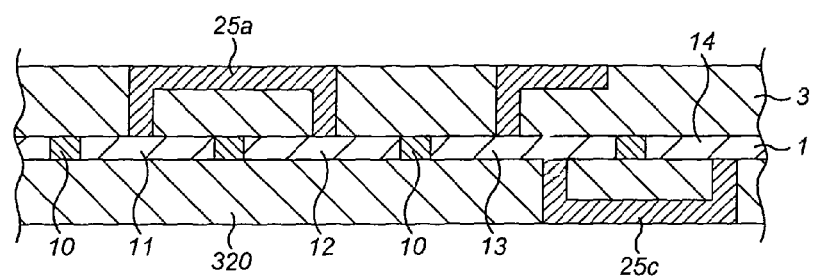

Referring now to FIG. 22, this shows an alternative structure performed using a method embodying the invention. Again, the structure comprises a patterned layer of insulative material 1, incorporating a plurality of insulative features 10. A first insulative layer 3 is formed on one side of the active layer 1, and a second layer of insulative material 320 is formed on the opposite side. A plurality of bodies of conductive material 25a, 25b and 25c have been formed, each one providing a respective conductive track let into a surface of the respective insulative layer, and at least one electrically conductive via extending down through the respective insulative layer 3 to a respective portion of the active layer 1.

Figure 23:
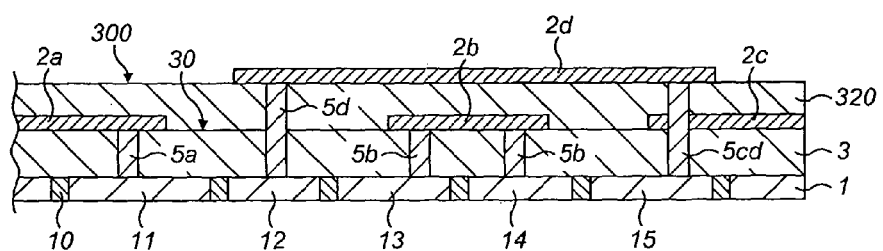

Referring now to FIG. 23, this shows another structure embodying the invention, and formed using a method embodying the invention. Again, the structure comprises a patterned layer of active material 1, and a first layer of insulative material 3. After forming the structure of the active layer 1 and first insulative layer 3, a plurality of holes have been formed, and then filled with conductive material to provide a first plurality of vias 5a, 5b each extending from the active layer 1 up to the surface 30 of the first layer of insulative material 3. Next, a plurality of conductive tracks 2a, 2b, and 2c have been formed on the surface 30, in the case of tracks 2a and 2b so as to connect to respective vias 5a, and 5b. At this stage, conductive track 2c is not connected to any via. Next, a second layer of insulative material 320 has been formed over the surface 30. Then, a second plurality of holes have been formed, and then filled with conductive material to form a second plurality of vias 5d, 5cd, each of these extending through both layers of insulative material, from the upper surface 300 down to the underlying active layer 1. Then, a second plurality of conductive tracks have been formed on the upper surface 300, although only one such conductive track 2d is shown in the figure. This conductive track connects together vias 5d and 5cd. It will be appreciated that via 5cd connects together both conductive track 2d and conductive track 2c, these conductive tracks being formed at different levels in the multi-layer structure.

Figure 24:
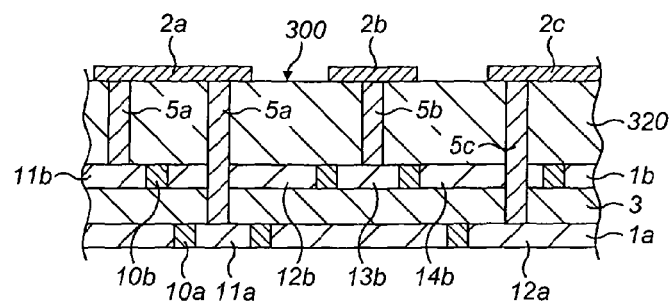

Referring now to FIG. 24, this shows yet another structure embodying the invention and produced using a method embodying the invention. In this example, the structure comprises a plurality of patterned layers of active material. A first layer of active material 1a is patterned with a first plurality of insulative features 10a, to define a plurality of electronic devices including terminal areas 11a and 12a. Above this first active layer 1a there is formed a first insulative layer 3. Above this layer 3 has been formed a second layer of active material 1b, patterned with a plurality of respective insulative features 10b. A second layer of insulative material 320 has been formed over the second active layer 1b, and has an upper surface 300. A plurality of holes have been formed, these holes extending from surface 300 down to a respective one of the active layers, and each hole has been filled with conductive material to provide a respective via. A plurality of conductive tracks 2a, 2b, and 2c have been formed on the surface 300 to connect together the vias 5a, 5b, 5c in a selected configuration. Thus, conductive track 2a connects together portion 11b of the second active layer 1b and portions 12b and 11a. Conductive track 2b connects just to portion 13b, and conductive track 2c is connected to portions 14b and 12a.

Figure 25:
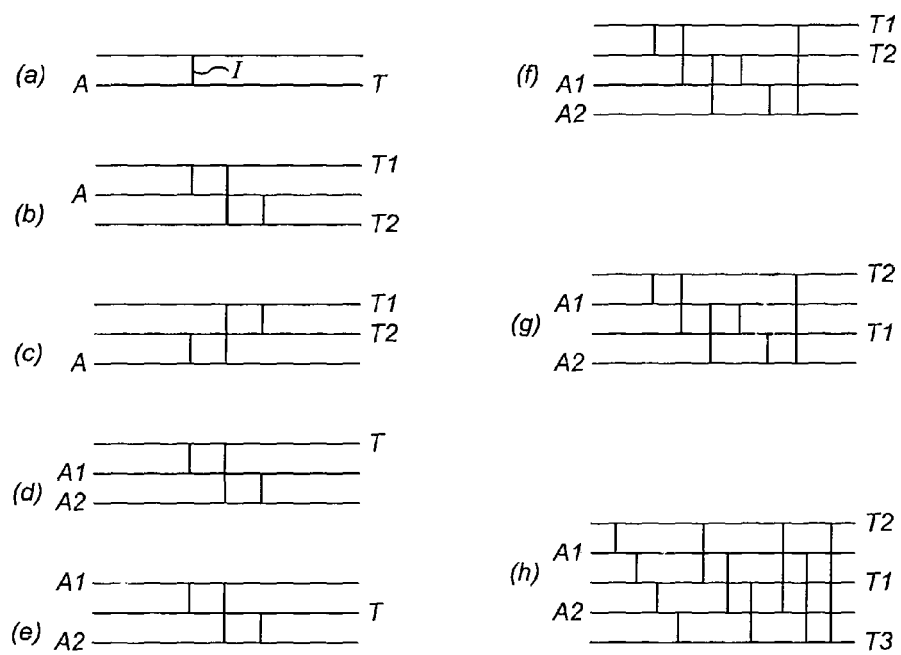
FIGS. 25a-h are schematic representations of areas configurations of active layers and conductive track layers (interconnect layers) which may be produced using methods embodying the present invention.

Referring now to FIG. 25, this is a highly schematic representation of different configurations of layers of active material and layers incorporating conductive tracks which may be formed using methods embodying the present invention. The interconnections between layers are shown by the vertical lines, labelled I in FIG. 25a, but not labelled in the other figures. It will be appreciated that each of these arrangements may be produced in essentially one of two ways, each of which embodies the present invention. In the first way, the layers of active material and conductive tracks may be formed, and then selected interconnections may subsequently be formed between them. In the second way, the layers of active material may be formed and then the interconnections (or vias) formed before the formation of the layers of conductive tracks. FIG. 25a shows an arrangement comprising a single active layer (A) and a single layer of conductive tracks (T). FIG. 25b shows a structure comprising a single active layer A and first and second layers of conductive tracks, T1 and T2, arranged on either side of the active layer. FIG. 25c shows an alternative structure comprising a single active layer, and first and second layers of conductive tracks T1 and T2, both arranged on one side of the active layer. FIG. 25d shows an alternative configuration comprising first and second patterned active layers A1, A2 and a single layer of interconnecting tracks T. FIG. 25e shows an alternative configuration comprising first and second patterned layers of active material A1, A2, arranged on either side of a conductive track layer T. FIG. 25f shows an alternative configuration comprising a plurality of patterned layers of active material A1, A2, and a plurality of conductive track layers T1, T2 arranged above the active layers. FIG. 25g shows an alternative arrangement of a plurality of active layers and a plurality of conductive track layers, those active and track layers being interleaved. FIG. 25h shows yet another arrangement comprising a plurality of active layers, and a plurality of conductive track layers interleaved.

Figure 26:
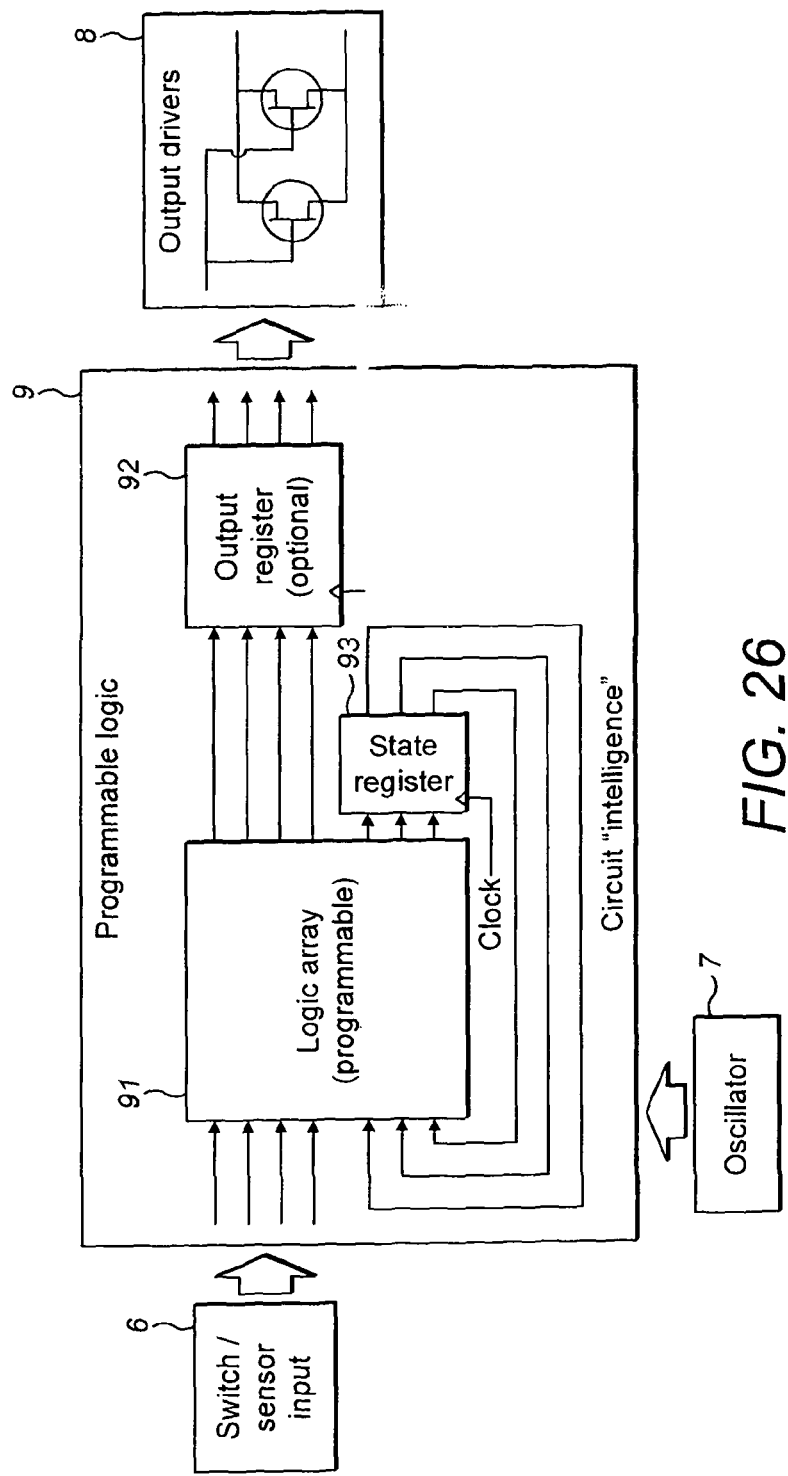
FIG. 26 is a functional block diagram of an electronic circuit embodying the invention and which may be produced using methods embodying the invention.

Referring now to FIG. 26, this is a functional block diagram of an electronic circuit embodying the invention and having been manufactured using a method also embodying the invention. The circuit comprises a switch/sensor input module 6, an oscillator 7, an output drive module 8, and a programmable logic module 9. The programmable logic module 9 comprises a programmable logical array 91, an output register module 92, and a state register module 93, arranged to receive a clock signal. The switch/sensor input module 6 provides a plurality of inputs to the logic array 91. This logic array is user programmable (i.e. user configurable) by means of making vias to connect selected conductive tracks to selected portions of the patterned active layer of semiconductive material, and/or by making selected connections between pre-formed vias extending down to respective portions of the patterned active layer of semiconductive material, using methods in accordance embodiments of the invention as described above. In addition to the state register being arranged to receive signals from the logic array 91, the state register also feeds back signals to the logic array 91. Further outputs from the logic array are supplied to the output register 92, which in turn provides output signals to the output driver module 8.

Figure 27:
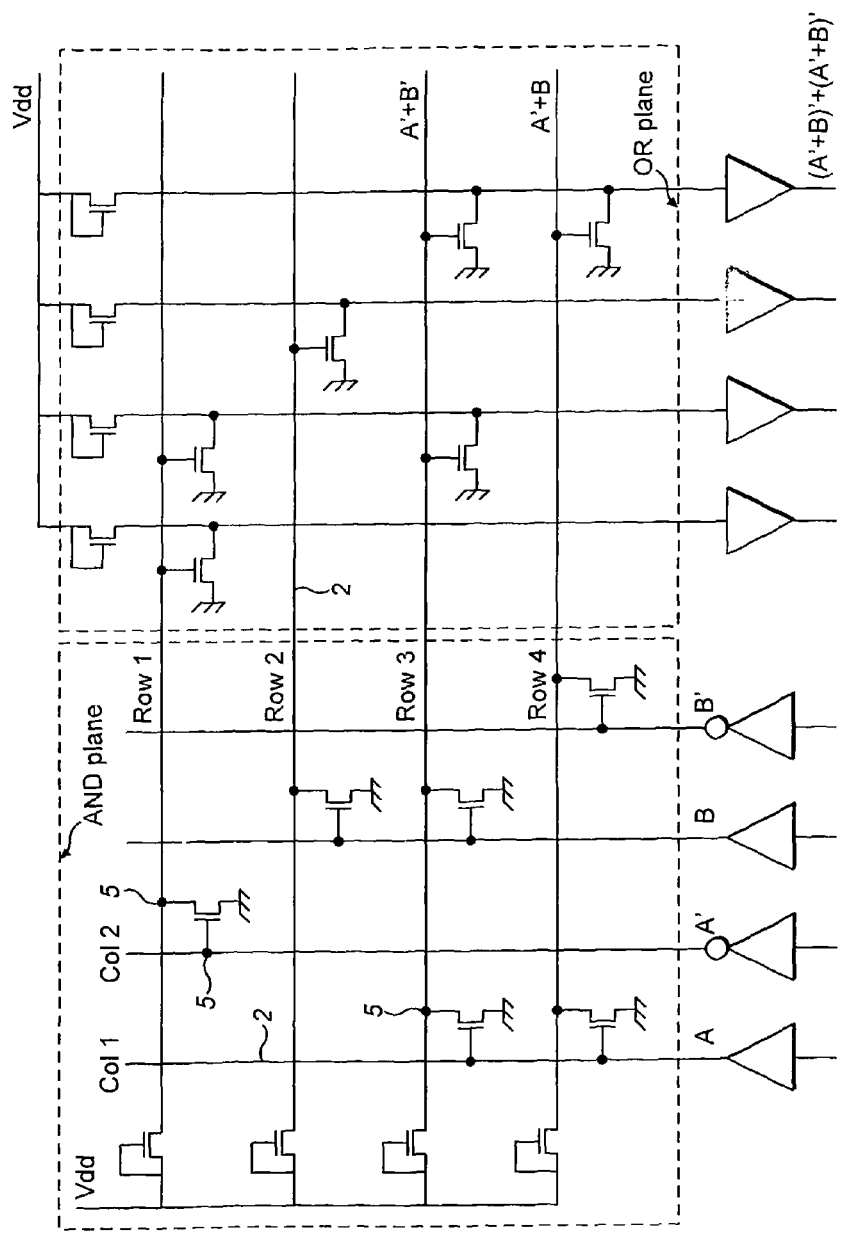
FIG. 27 is a schematic representation of parts of an electronic circuit embodying the invention.

Referring now to FIG. 27, this is a schematic representation of certain components and their interconnections in a programmable logic array (which may also be referred to as a programmable logic device) embodying the invention and having been produced by a method embodying the invention. As can be seen from the figure, the programmable logic array comprises a plurality of column tracks and a plurality of row tracks, and these tracks, in a grid formation, are positioned so as to overlay a rectangular array of substantially planar field-effect transistors formed in a layer of active (in this case semiconductive) material. Although not shown in the figure, there is a planar FET provided at a position corresponding to each intersection of a column and row track. In order to configure (i.e. determine) the logical operation of the circuit, a plurality of electrical connections 5 have been formed, each electrical connection (which may also be described as a via) is formed using a method embodying the invention, and connects a respective column or row track to a respective terminal of a respective one of the transistors formed in the layer of active material. In effect, the number and position of the vias 5, formed to connect pre-formed device terminals and column or row tracks, determines which of the underlying electronic devices are selected for part of the logic circuit. The placement of the vias at selected positions in effect programs the circuit.

Figure 28:
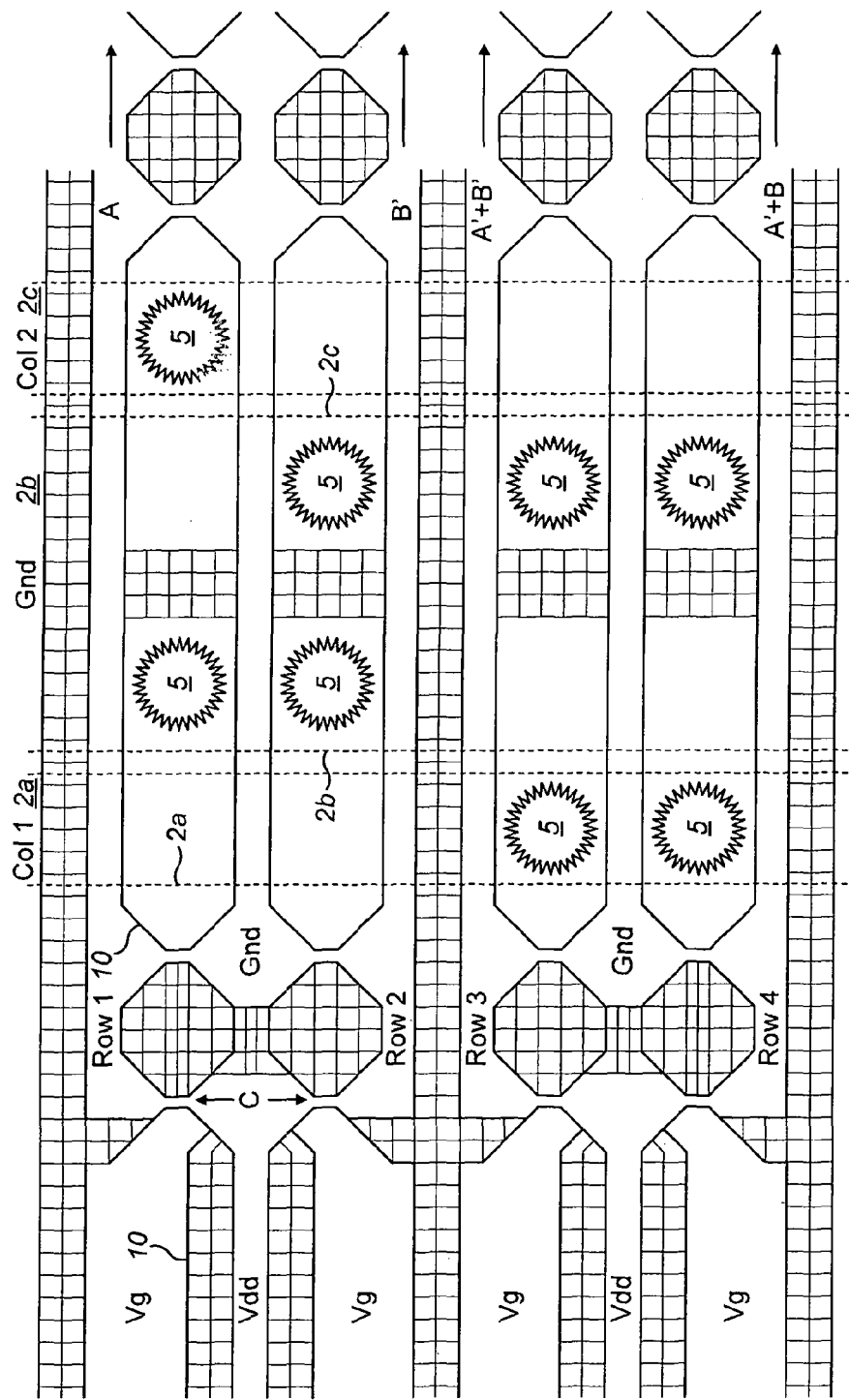
FIG. 28 is a representation of part of another electronic circuit embodying the invention.

Referring now to FIG. 28, this shows part of a nano-scale programmable logic array embodying the invention. The figure shows a pattern of insulative features 10 formed in a layer of active material to define a plurality of electronic devices, each device comprising a plurality of terminals. Each device comprises a conductive channel C of semiconductive material, defined between closely-spaced parallel portions of the insulated features. The conductivity of each channel is controlled, at least in part, by the potential applied to a respective side-gate terminal. Also shown in the figure are the positions of a plurality of overlapping tracks 2a, 2b and 2c. Track 2a is a column track, nominally column 1, track 2b is a ground track, and track 2c is another column track, nominally column 2. As will be seen, each column track overlaps a plurality of device terminal areas. A plurality of electrical connections (or vias) 5 have been formed to selectively connect the tracks and terminal areas. Thus, the positioning of the vias 5 has determined which device terminal is connected to which column track, and which device terminal is connected to ground.

Figure 29A:
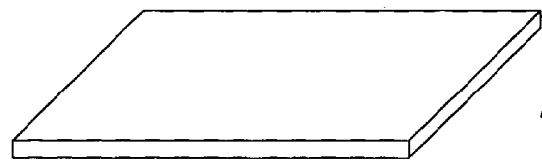
FIGS. 29a-29j illustrate steps in two other methods embodying the invention.
Figure 29B:
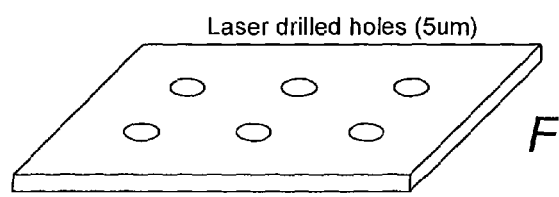
Figure 29C:
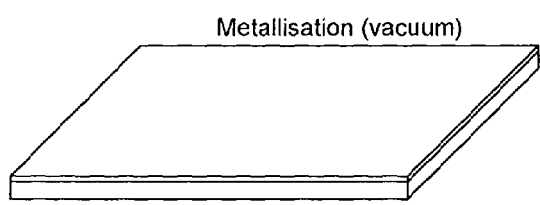
Figure 29D:
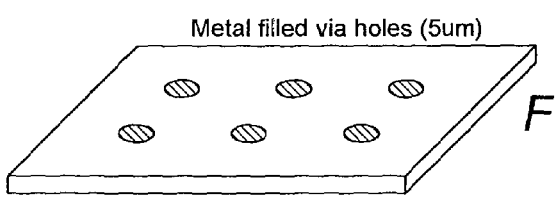
Figure 29E:
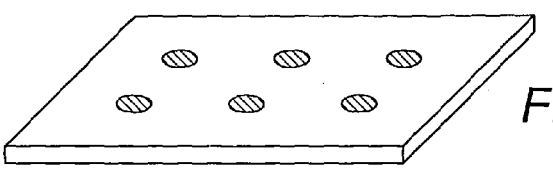

Referring now to FIGS. 29a-29e, these illustrate steps in another method embodying the invention. FIG. 29a shows a flexible substrate, in this case polyimide, in which via-holes will be laser-drilled from the bottom-side. Optionally a planarization and/or lift-off layer may be provided on top of the substrate. FIG. 29b shows laser-drilled via-holes exiting from the top-side of the polyimide, in this case 5 um diameter. FIG. 29c shows a subsequent stage in which the whole of the top-surface of the substrate has been covered by deposition (e.g. vacuum deposition) of conductive metal, such as tungsten. The via-holes have also been substantially filled with metal. In certain embodiments a planarization coating may be needed onto a plastic substrate, e.g. PMMA. FIG. 29d shows a further stage in which the metal is removed from the top-surface of the substrate, e.g. by dry-etching or wet-etching/ "lift-off" (if a suitable undercut of a resist material can be achieved). FIG. 29e shows an array of infilled via-holes which could be connected to certain terminals of substantially planar electronic devices (not shown for clarity). Selection of these vias by placement of additional conductive tracks provides programmability based on a target final circuit. Interconnections may be made on top of and/or underneath the structure, provided sufficient insulation and/or passivation is used to reduce losses via capacitance.

Figure 29F:
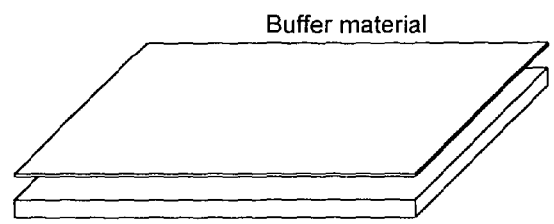
Figure 29G:
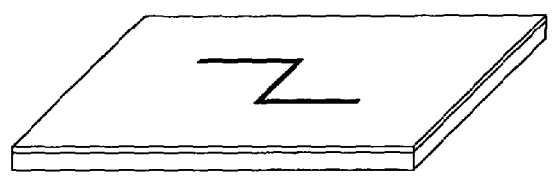
Figure 29H:
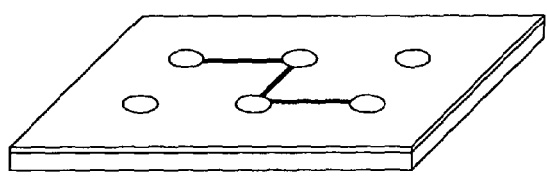
Figure 29I:
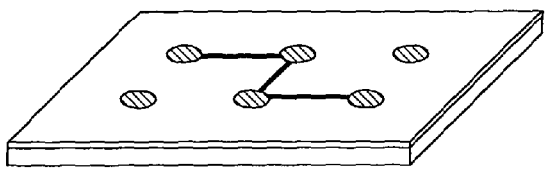
Figure 29J:
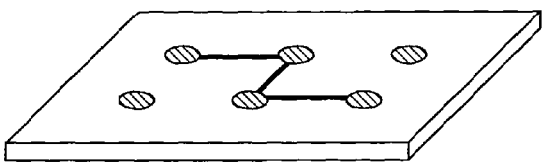

Referring now to FIGS. 29f to 29j, these illustrate steps in another method embodying the invention. FIG. 29f shows an alternative approach in which an insulative buffer material, such as a thermoplastic, has been deposited over a flexible substrate, in this case polyimide (i.e. the figure shows the deposition of a planarisation layer). FIG. 29g shows a patterning step (the UV microembossing of buffer material to define an interconnect) in which a set of trenches/grooves are produced within the insulative buffer material such that the lower-part of the trench/groove completely clears the bottom of the insulative buffer material. FIG. 29h shows a subsequent step in which via-holes are produced (by laser drilling in this example) to coincide with the trenches/grooves and to connect to a terminal of a substantially planar electronic device on the substrate (located on bottom-side of substrate). FIG. 29i shows a further step in which the top-surface of the insulative buffer material is covered with conductive metal, e.g. by vacuum deposition. FIG. 29j shows a final step in which the insulative buffer material is completely removed, such as by solvent stripping (a resist with undercut may be used to aid this process), to leave a patterned set of via-holes and connecting conductive tracks.

Figure 30:
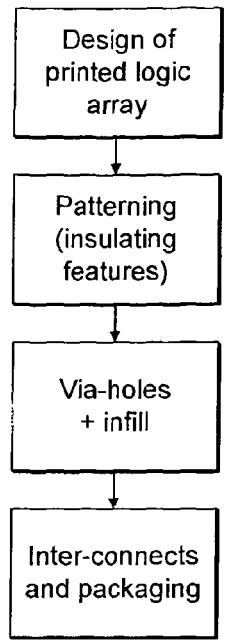
FIG. 30 is a flow chart illustrating steps in a method embodying the invention.

Referring now to FIG. 30, this is a flow chart illustrating steps in a method embodying the invention. A first step S1 is a design step in which a printed logic array is designed. This is followed by a patterning step S2, in which a pattern on insulative features is formed in a layer of active material to define a plurality of electronic devices. Next, in step S3, a plurality of wire-holes are formed and then infilled to produce electrical connections to areas of active material. Finally, in step S4 a plurality of interconnects are made (to connect together selected vias) and the printed logic array is packaged.

In more detail, step S1 comprises the following sub-steps:
1. The layout of a generic programmable logic array is designed, the generic programmable logic array comprising a plurality of selectable electronic devices, for example in the form of AND/OR planes, etc.
2. This design is transferred to a master (for example the design can be directly written on a silicon wafer by e-beam lithography+DRIE).
3. A patterning template is produced (e.g. the silicon master may be transferred to a nickel shim; and then a transparent stamp may be prepared).
4. Next there follows analysis/metrology of the patterning template.
5. Next there follows a quality assurance acceptance step, if appropriate.

In further detail, step S2 comprises the following sub-steps in certain embodiments of the invention:
1. Cleaning and preparation of substrate.
2. Deposition of semiconductor layer onto substrate (and the optional formation of additional layers between the semiconductor and the substrate).
3. Patterning of semiconductor layer, e.g. by thermal embossing; imprint lithography (thermal or UV) and reactive ion etch (RIE).
4. Passivation of semiconductor with dielectric material.
5. Analysis/metrology of patterned semiconductor.

In more detail, step S3 may comprise the following sub-steps:
1. Transfer of via-hole pattern to machine control.
2. Via-hole drilling, e.g. laser-drilling, mechanical punching, mask and etch.
3. Infill of via holes, e.g. ink jet printing, vacuum evaporations/sputter coating and etch.
4. Analysis/metrology/electrical testing of via-holes.
5. Quality assurance acceptance.

In more detail, step S4 in certain embodiments may comprise the following sub-steps:
1. Selection of application-specific logic functions from generic programmable logic array.

2. Transfer of selected logic functions to write-equipment.
3. Writing of interconnects, e.g. by ink jet or Gravure printing.
4. Analysis/metrology/electrical testing of printed programmable logic device.
5. Encapsulation, packaging and final QA acceptance.

It will be appreciated that in certain embodiments of the invention the interconnections produced could be on two or more levels. One or more of these interconnect layers could be fixed, and one or more of the interconnect layers could be programmable.

Figure 31:
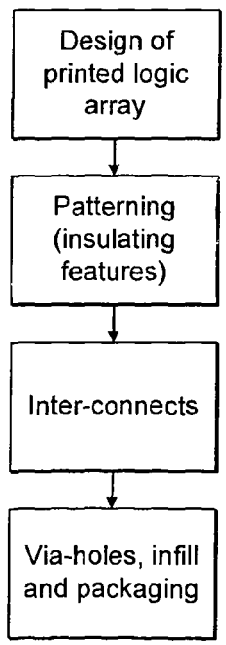
FIG. 31 is a flow chart illustrating steps in another method embodying the invention.

Referring now to FIG. 31, this is another flow chart illustrating steps in another method embodying the invention. This method can be described as a printed logic fabrication process. The method begins with step S1, in which a printed logic array is designed. Then in step S2, there is a patterning step, in which insulating features are formed in one or more layers of active material. Then, in step S3, interconnects are formed to provide an array of selectable interconnects to respective portions of the patterned active layer or layers. Finally, in step S4, a plurality of via-holes are formed, infilled, and the device is packaged.

In more detail, in certain embodiments step S1 comprises the following sub-steps:
1. Layout design of generic programmable logic array, e.g. and/or plane etc.
2. Transfer design to master (e.g. direct-write of silicon stamp).
3. Produce patterning template (e.g. transfer of silicon master to nickel shim; preparation of transparent stamp).
4. Analysis/metrology of patterning template.
5. QA acceptance.

In certain embodiments, step S2 comprises the following sub-steps:
1. Cleaning and preparation of substrate.
2. Deposition of semiconductor layer onto substrate (optional additional layers between semiconductor and substrate).
3. Patterning of semiconductor layer, e.g. thermal embossing; imprint lithography (thermal or UV) and RIE.
4. Passivation of semiconductor with dielectric material.
5. Analysis/metrology of patterned semiconductor.

In certain embodiments, step S3 comprises the following sub-steps:
1. Determination of interconnect pattern (at least one level).
2. Writing of interconnect pattern, e.g. by ink jet printing, Gravure printing, mask and deposition, patterning and infill, demetalisation.
3. Analysis/metrology/electrical testing of interconnects.
4. QA acceptance.

In certain embodiments, step S4 comprises the following sub-steps:
1. Selection of required devices or function-blocks for application-specific programmable logic.
2. Drilling and infill of selected vias, e.g. by laser-drilling and ink jet printing.
3. Analysis/metrology/electrical testing of printed programmable logic device.
4. Encapsulation, packaging and final QA acceptance.

It would be appreciated that in certain embodiments, all interconnects and vias could be produced and then selectively destroyed, e.g. by laser ablation, to provide programmability.

Figure 32A:
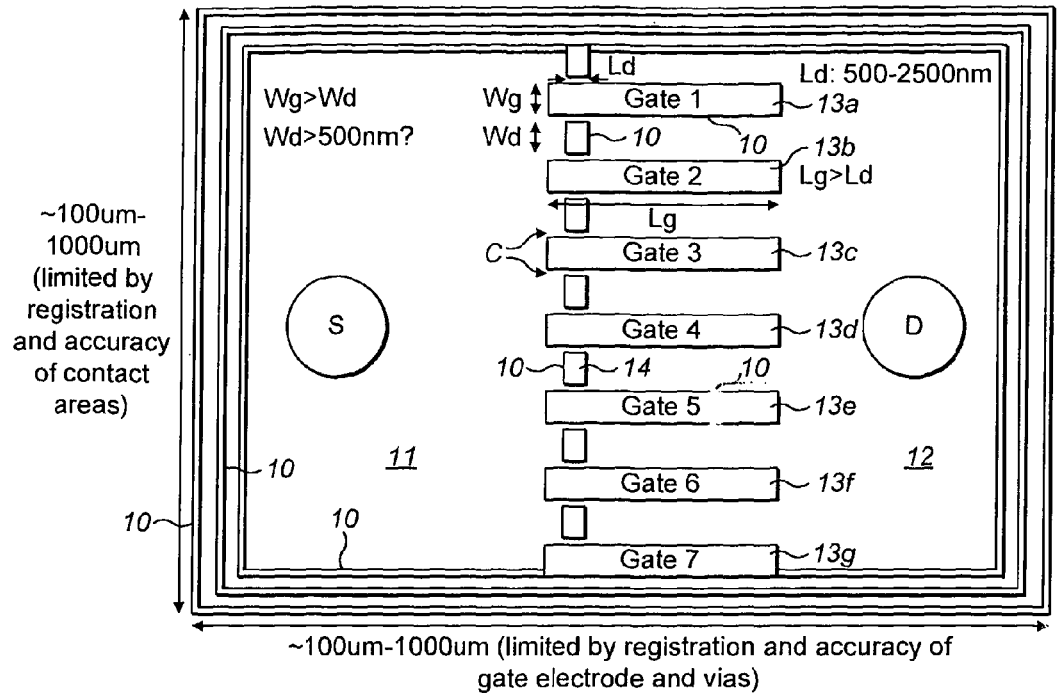
FIGS. 32a and b illustrate steps in the manufacture of another electronic circuit embodying the invention.

Referring now to FIG. 32a, this shows part of an electronic circuit embodying the invention, and comprising a plurality of planar transistors arranged in parallel and defined by a plurality of insulative features 10 formed in a layer of semi-conductive material. As can be seen in the figure, the transistors arranged in parallel have a common source terminal area 11, and a communal drain terminal area 12. For each transistor, these source and drain areas 11 and 12 are connected by a respective narrow channel C of semiconductive material defined by parallel portions of the insulative features 10. The arrangement comprises a plurality of gate terminal areas 13a-13g, each defined by a respective insulative perimeter 10. It will be appreciated that each gate, in the illustrated configuration, can modulate one or two planar transistors. Above each gate terminal area there is a respective insulating area 14, again surrounded by an insulative perimeter 10. These are insulating areas 14, but are not used as gates in this example. Indicative dimensions are shown on the figure. It will be appreciated that by arranging the plurality of transistors in parallel, the total current that can be handled by the resultant circuit is increased.

Figure 32B:
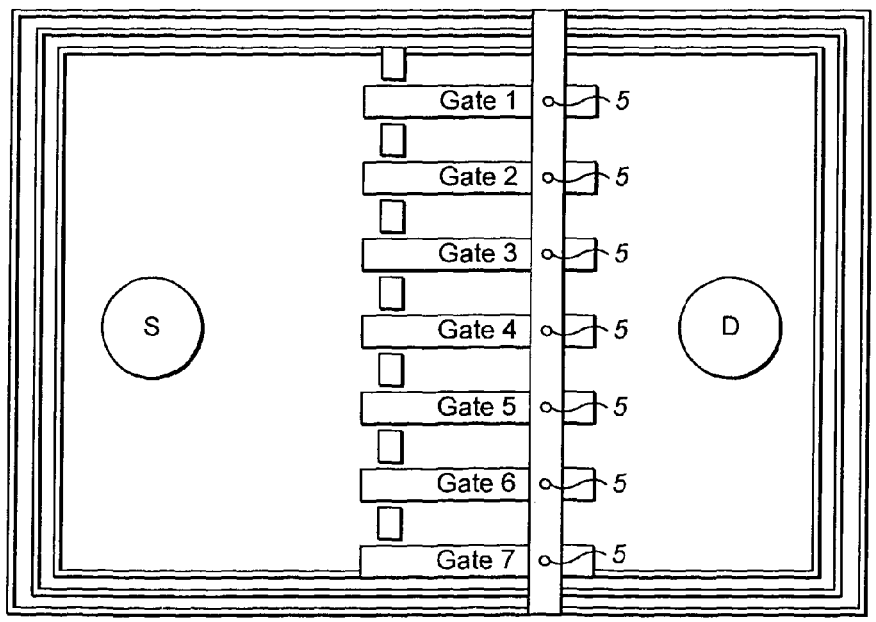

Referring now to FIG. 32b, this illustrates the resultant structure when a conductive track (spaced from the active layer by at least one insulative layer, not shown in the figure) has been formed so as to overlap each of the gates in the arrangement of FIG. 32a, and has been electrically connected to each gate by a respective electrically conductive via 5 passing through the track, the underlying insulative layer, and two the respective portion of active layer material forming each gate terminal. Thus, the track in FIG. 2, by means of the vias 5, electrically ties all of the gates together so that the same potential can be applied to all gates simultaneously simply by applying that potential to the track too. This arrangement provides particular advantages for printed electronics; it allows registration of the common gate electrode (either underneath or on top of the active layer) with through vias. The parallel transistors enable increased output current, which may be required to turn-on a particular output component, such as LEDs.

Figure 33:
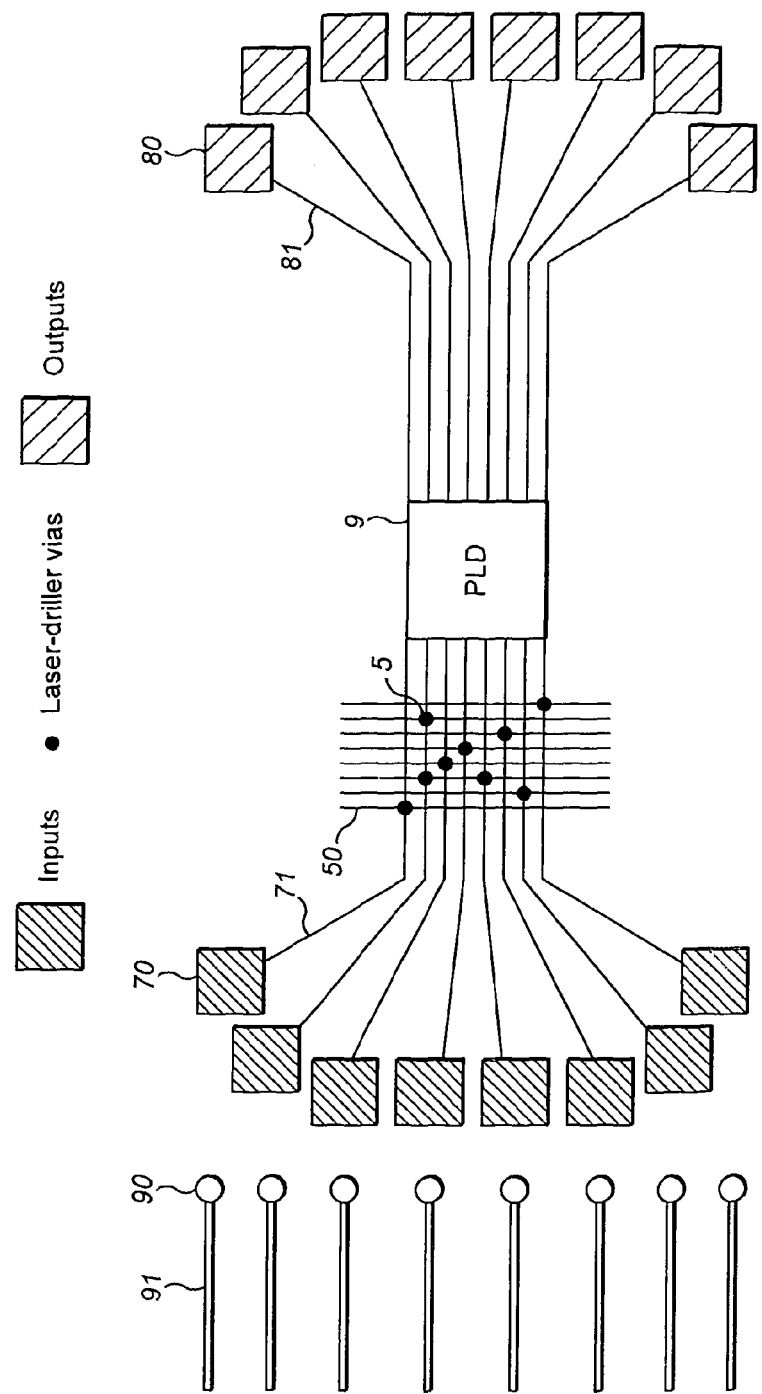
FIG. 33 is a schematic representation of a programmable (i.e. user configurable) electronic circuit embodying the invention and manufactured in accordance with an embodiment of the invention.

Referring now to FIG. 33, this illustrates another electronic circuit incorporating a programmable logic device embodying the invention and produced using a method embodying the invention. The circuit comprises a plurality of input pads 70, each connected by a respective input line 71 to a programmable logic device 9. The circuit also comprises a plurality of output pads 80, each connected by a respective output line 81 to the programmable logic device 9. Overlapping the array of input line 71 is an array of further lines or tracks 50. A plurality of laser-drilled and filled vias 5 are provided at selected positions on the array of overlapping lines 50 and input line 71 to make selected connections between those devices. Additionally there are provided input pins 90 and input pin-lines 91 which can be individually held at a particular voltage associated with a logic-state "0" or "1". Overlaying of input pads 70 onto input pins 90 can configure the input lines 71 to a particular logic-state. Similarly, tracks 50 may be individually held at a particular voltage associated with a logic-state "0" or "1". Selection of vias 5 can additionally program input-lines 71 to a particular logic state. It will be appreciated that one or both of these approaches to externally configure or program the inputs of the programmable logic device 9 may be used. Conversely, the output lines may be configured or programmed using a similar approach. The use of vias 5 enables factory programming by the manufacturer and the use of input pads 70 allows field programming by the end user.

Figure 34:
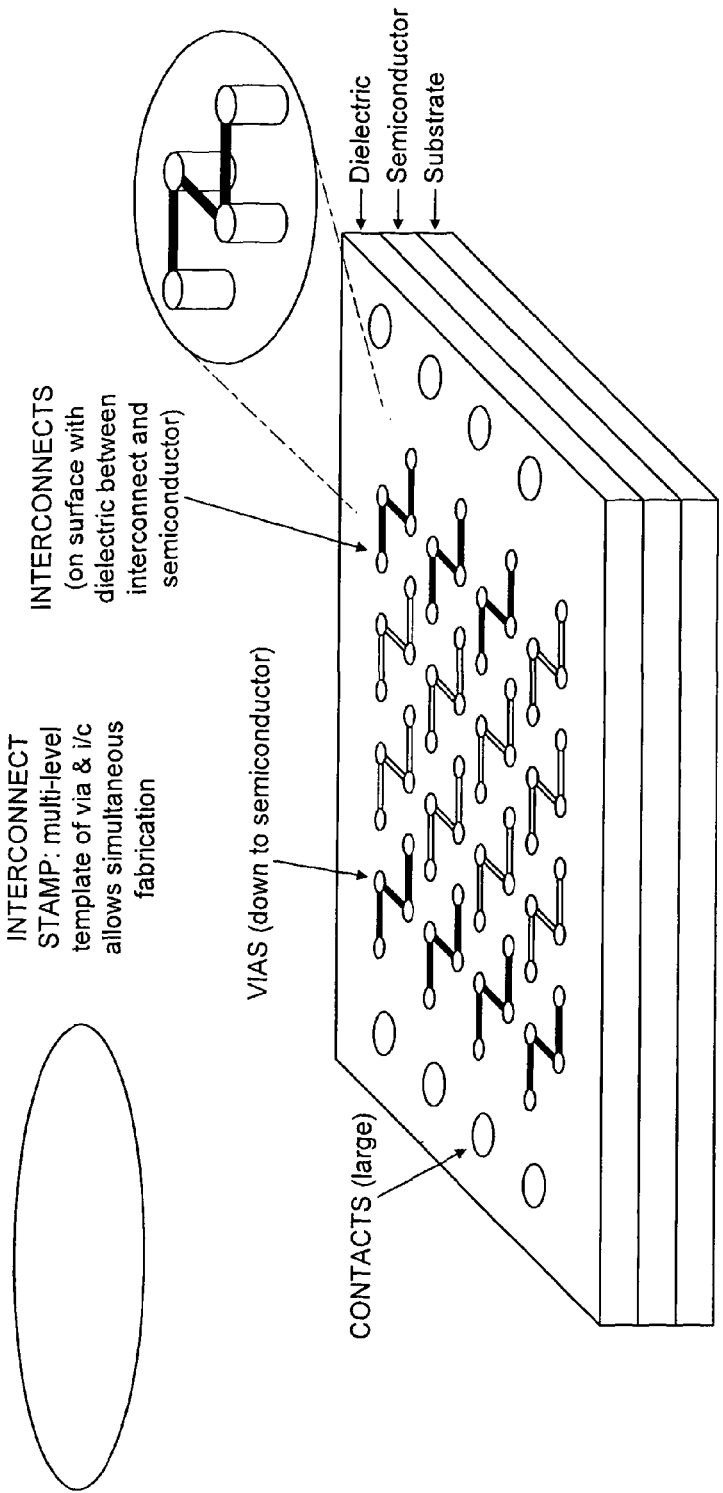
FIG. 34 is a schematic representation of part of another electronic circuit manufactured in accordance with an embodiment of the invention.
Figure 35:
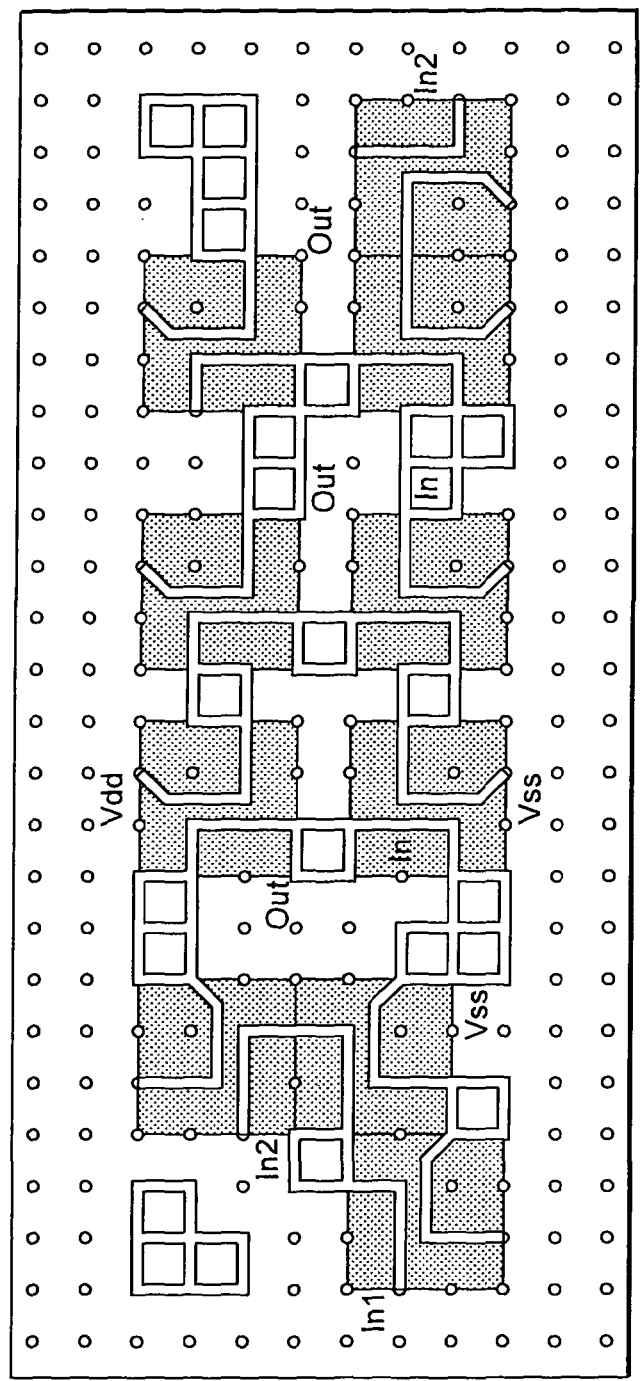
FIG. 35 is a plan view of a plurality of planar electronic devices defined by insulative features in a layer of active material in an embodiment of the invention.

Referring now to FIG. 34, this is a schematic perspective view of a plurality of interconnects and vias formed in a structure using a method embodying the invention Referring now to FIG. 35, this illustrates part of a patterned active layer of an electronic circuit embodying the invention.

The active layer has been patterned with a plurality of insulative features which define a plurality of planar transistors. The plurality of insulative features also define a plurality of connections between the planar transistors. In other words, the planar transistors are connected directly through semiconductor material. The insulative features (in this example insulative trenches) also form isolation between devices. The interconnections between the transistors at this level (i.e. in the layer of active (i.e. semiconductor) material itself), can be regarded as "level 0" connections, in other words local interconnections.

Figure 36:
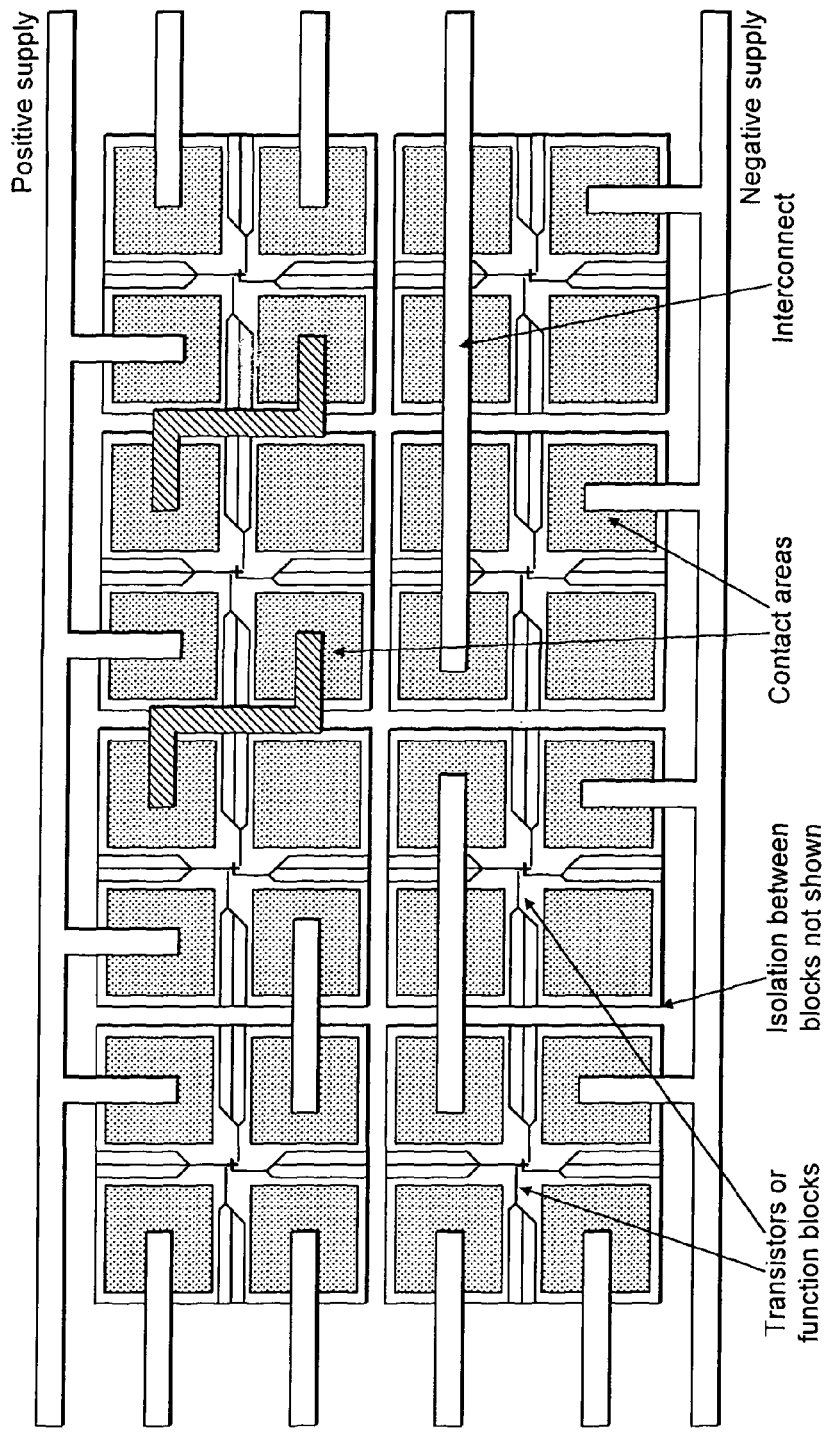
FIG. 36 is a schematic representation of interconnects formed between terminals of a plurality of planar electronic devices formed in a layer of active material in an embodiment of the invention.

Moving on to FIG. 36, this shows an additional level of interconnections, which may be referred to as fine interconnects, which may be used in embodiments of the invention. Here, interconnects are formed above the plane of the layer of active material. Some of these interconnections connect selected contact areas of the active layer to a positive supply rail, and others to a negative supply rail. Further interconnects provide connections between contact areas that are connected in the active layer itself to terminal areas of various devices. The interconnects at this "level 1" provide out-of-plane connections between transistors or function blocks in the active layer. In certain embodiments it is possible to register vias and interconnects to less than +/−3 microns.

Figure 37:
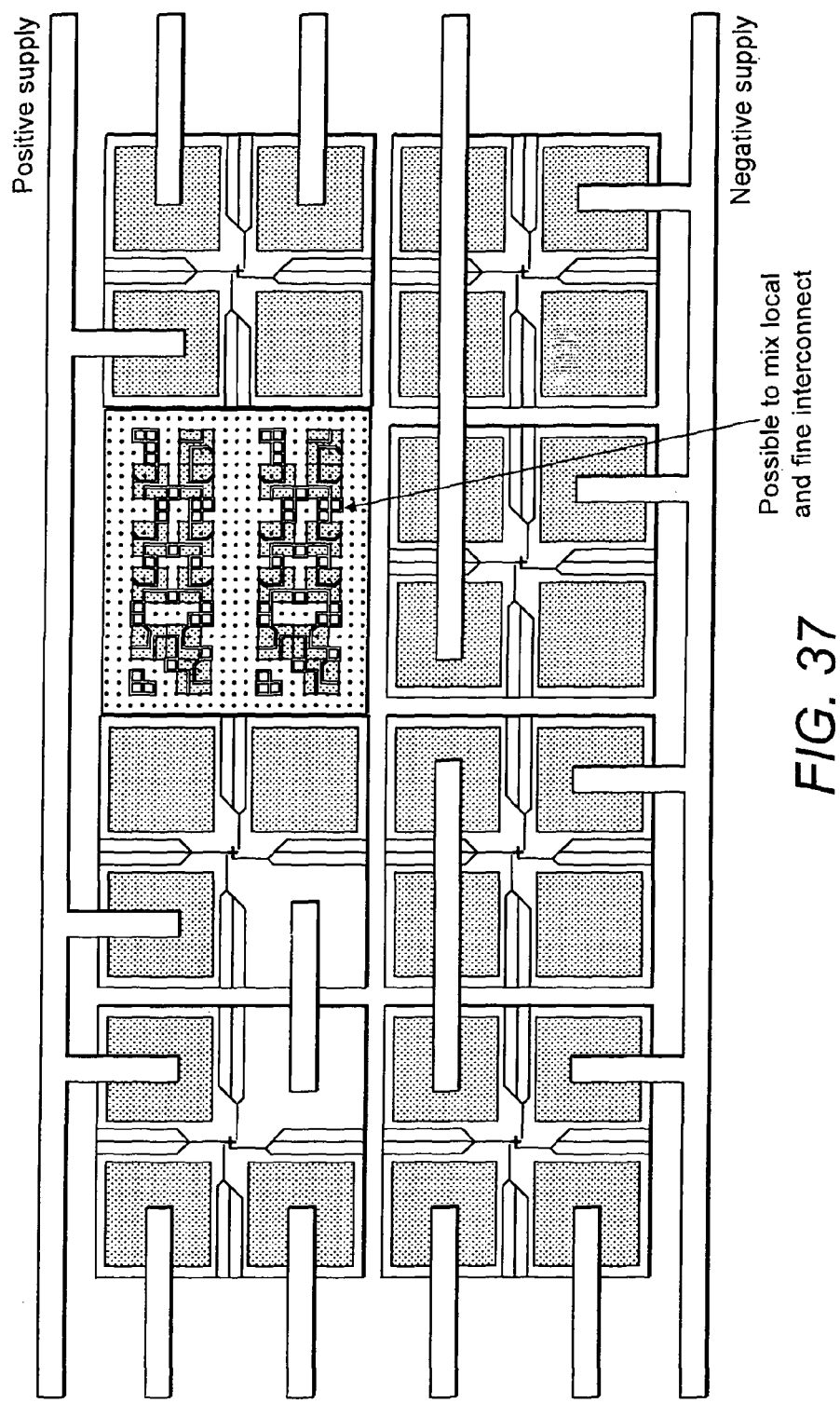
FIG. 37 is a schematic plan view of two levels of interconnects formed in an electronic circuit embodying the invention using techniques embodying the invention.

Referring now to FIG. 37, this is an illustration of part of a circuit embodying the invention, and shows the level 0 and level 1 interconnections combined.

Figure 38:
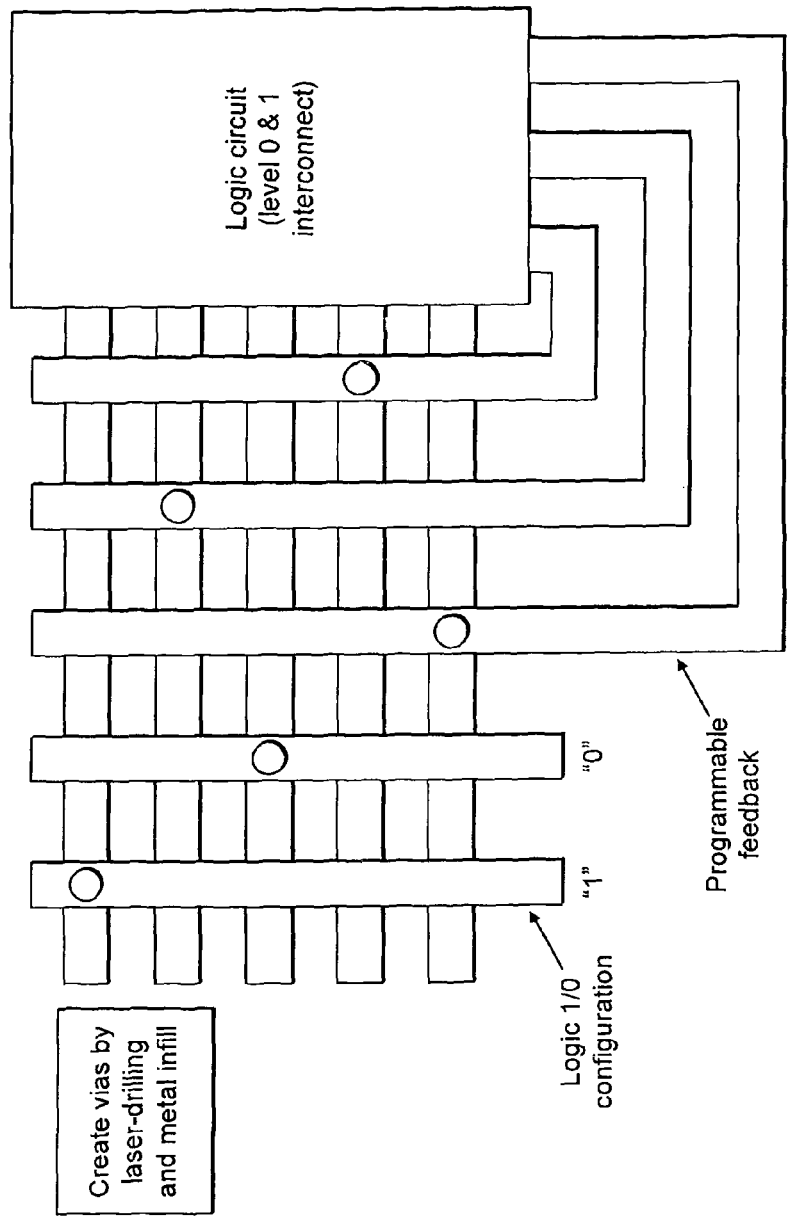
FIG. 38 is a schematic representation of further interconnections formed using a method embodying the invention and incorporated in structures embodying the invention.

Referring now to FIG. 38, this shows a higher level (which may be referred to as level 2) of interconnect, in which programmed vias are formed). As can be seen, the logic circuit, within which level 0 and level 1 interconnects are formed as shown in the preceding figures, is connected to various input lines. Crossing these input lines there are tracks corresponding to logic number 1 and logic number 0, and also lines providing feedback. A plurality of selected connections are formed between these overlapping input lines, logic lines, and feedback lines by the appropriate positioning of vias 5 produced by suitable hole formation (e.g. by laser, drilling) and metal infill.

Figure 39:
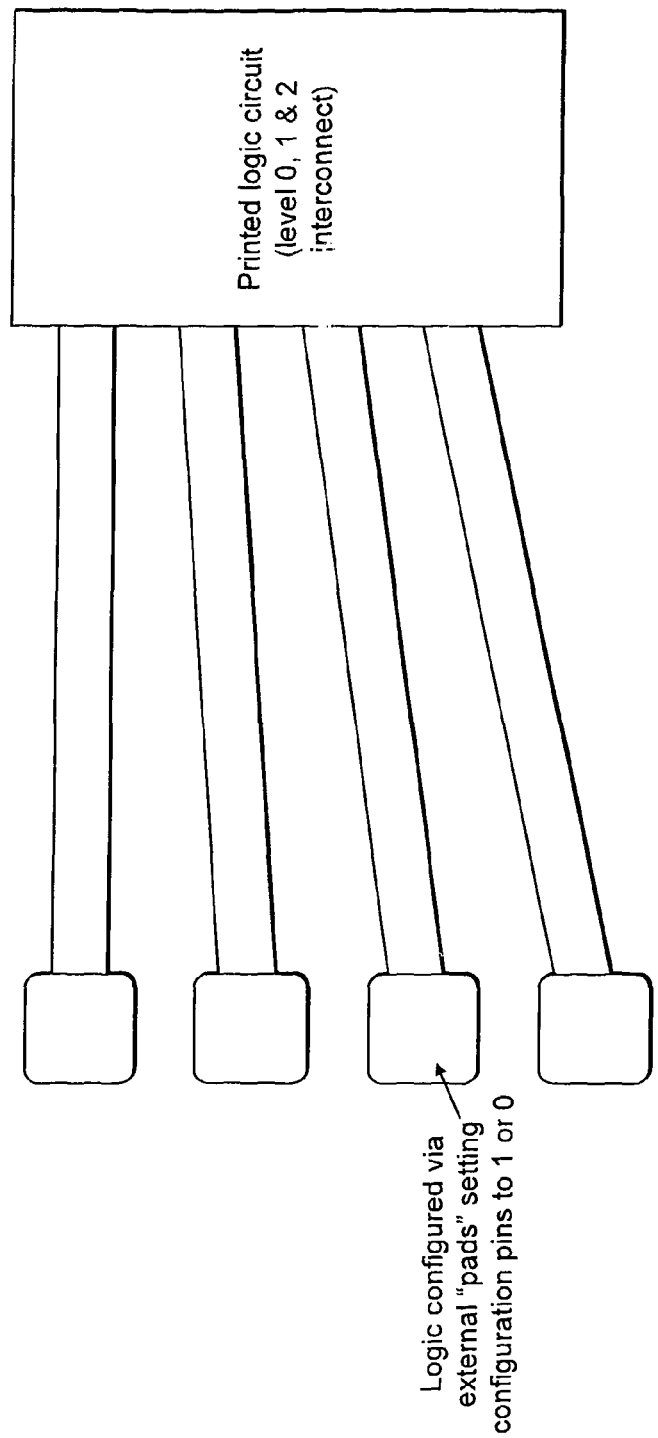
FIG. 39 is a schematic representation of another level of interconnects which lies in embodiments of the invention.
Figure 40:
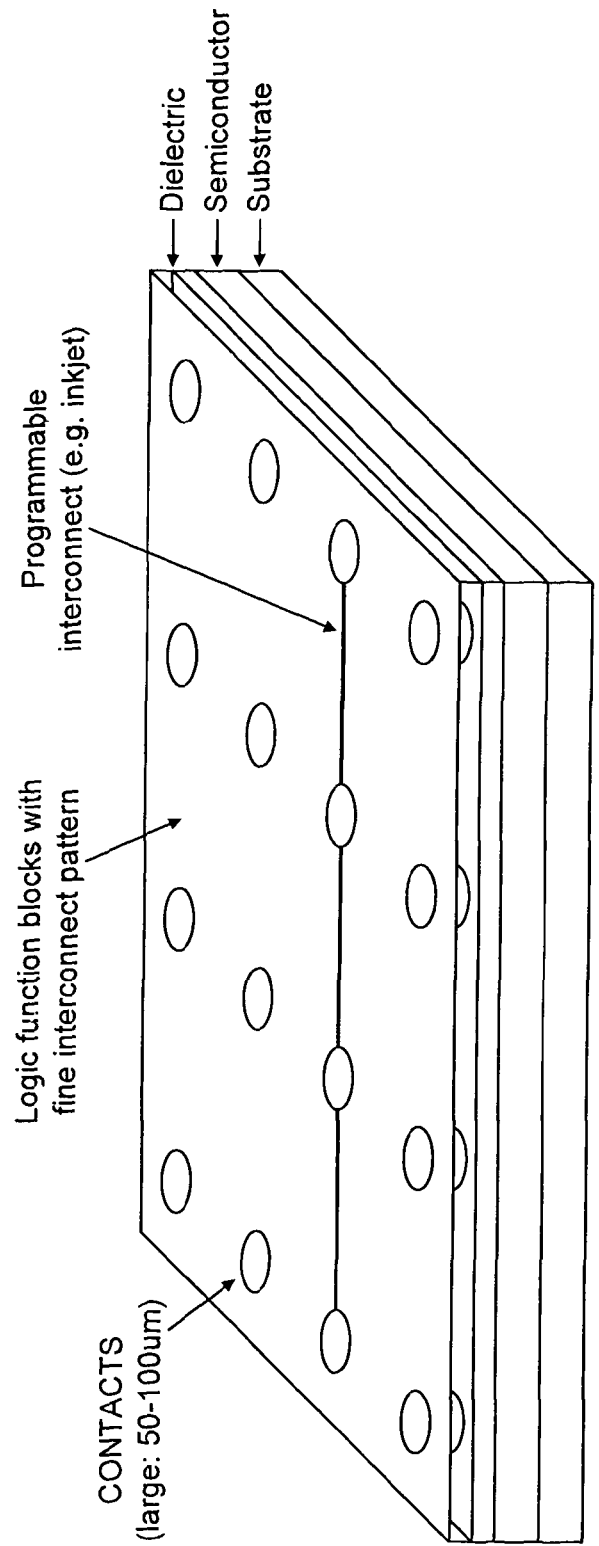
FIG. 40 is a schematic representation of part of another structure formed using methods embodying the invention.

Referring now to FIG. 39, this is an illustration of a third level of interconnections or electrical connections (which may be referred to as level 3) which may be incorporated in electronic circuits and structures embodying the invention. At this third level, a plurality of external pads are provided, each of these pads being connected by a respective conductive track to the printed logic circuit incorporating level 0, 1 and 2 interconnects, as described above. These external pads enable logical functions of the printed logic circuit to be configured, as with the external pads pins can be configured by setting them to logic 1 or logic 0, for example. Referring now to FIG. 40, this illustrates another structure formed using methods embodying the present invention. FIG. 40 shows an alternative approach to programming substantially planar electronic devices. Within the semiconductor layer arrays of substantially planar electronic devices have been formed by creating insulative features, for example by methods disclosed in the Applicant's published and/or co-pending patent applications WO02/086973A2, WO2006/008467A1, WO2006/120414A2, GB0819684.2, GB0814028.7, GB0901389.7, GB0915250.5, and GB0905310.9, the contents of which are incorporated herein by reference. These substantially planar electronic devices have been interconnected, such as by methods disclosed in the Applicant's above-referenced published and/or co-pending patent applications. A dielectric layer, containing large via-holes (in this case 50-100 um) is arranged above the interconnected planar electronic devices. The interconnected planar electronic devices are already programmed to provide different functionalities, such clock, LED driver, memory (volatile or non-volatile), diode, transistor, etc. The large contacts within the dielectric layer connect to input or output terminal of the substantially planar electronic devices, and are sufficiently large such that they can be connected on the top-surface of the dielectric, e.g. using inkjet printing, to select and connect together different functionalities. In conventional silicon integrated circuits, a system-on-chip device is typically one where complex pre-defined function as used building blocks and then interconnected using fixed interconnect to define the system functionality. Therefore the final device can be described as a "Printed System-on-Chip" (PSoC) which has been programmed by digital printing.

Figure 41:
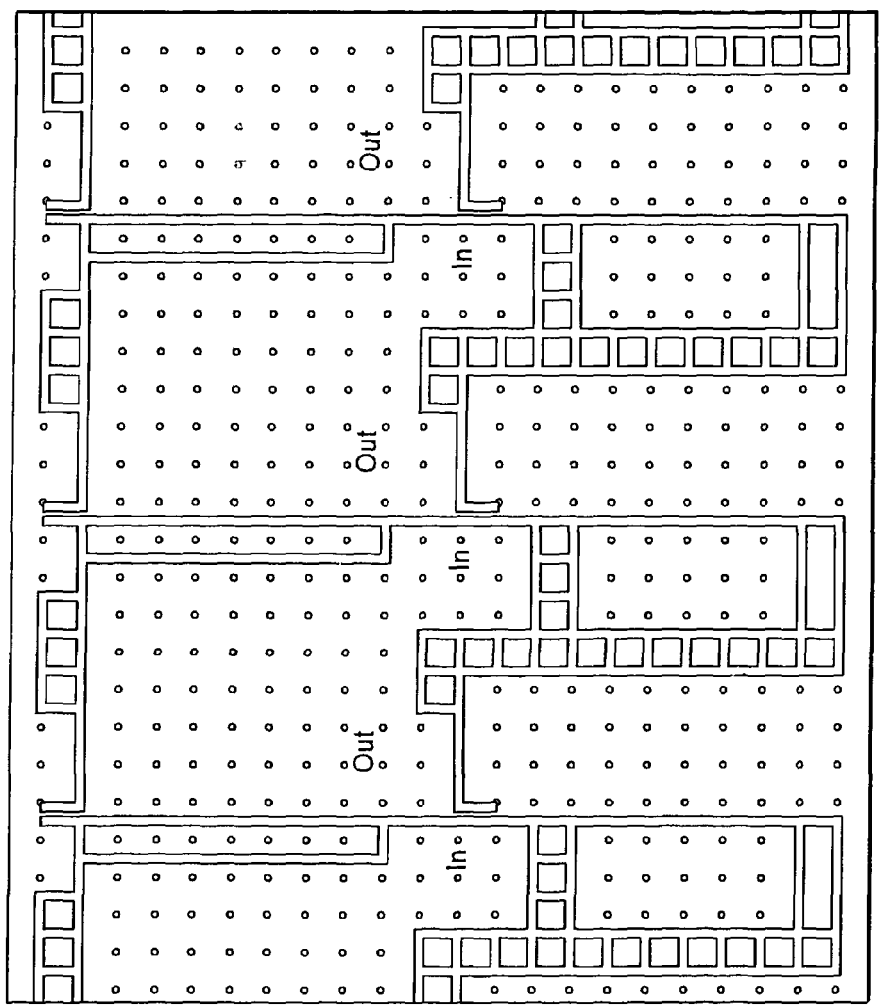
FIG. 41 is a schematic representation of part of another electronic circuit embodying the invention, illustrating local interconnections between planar electronic devices, that is connections provided by portions of the layer of active material itself.

Referring now to FIG. 41, this is another representation of part of a patterned layer of active material in an embodiment of the invention. The active layer of semiconductor material has been patterned with a plurality of insulative features, in the form of insulating trenches. The illustrated portion of the active layer comprises a plurality of planar transistors defined by the insulated features, and a plurality of connections between the transistors are provided directly through the semiconductor (in other words, these in-plane connections are also defined by the insulated features). In the illustrated arrangement, three inverters have been formed, those inverters being connected in series. The insulating trenches also form isolation between the devices. Physically, the transistor and isolation trenches can be identical. The interconnections between devices in the arrangement shown in FIG. 41 can be regarded as level 0 interconnections, i.e. local interconnections.

Figure 42:
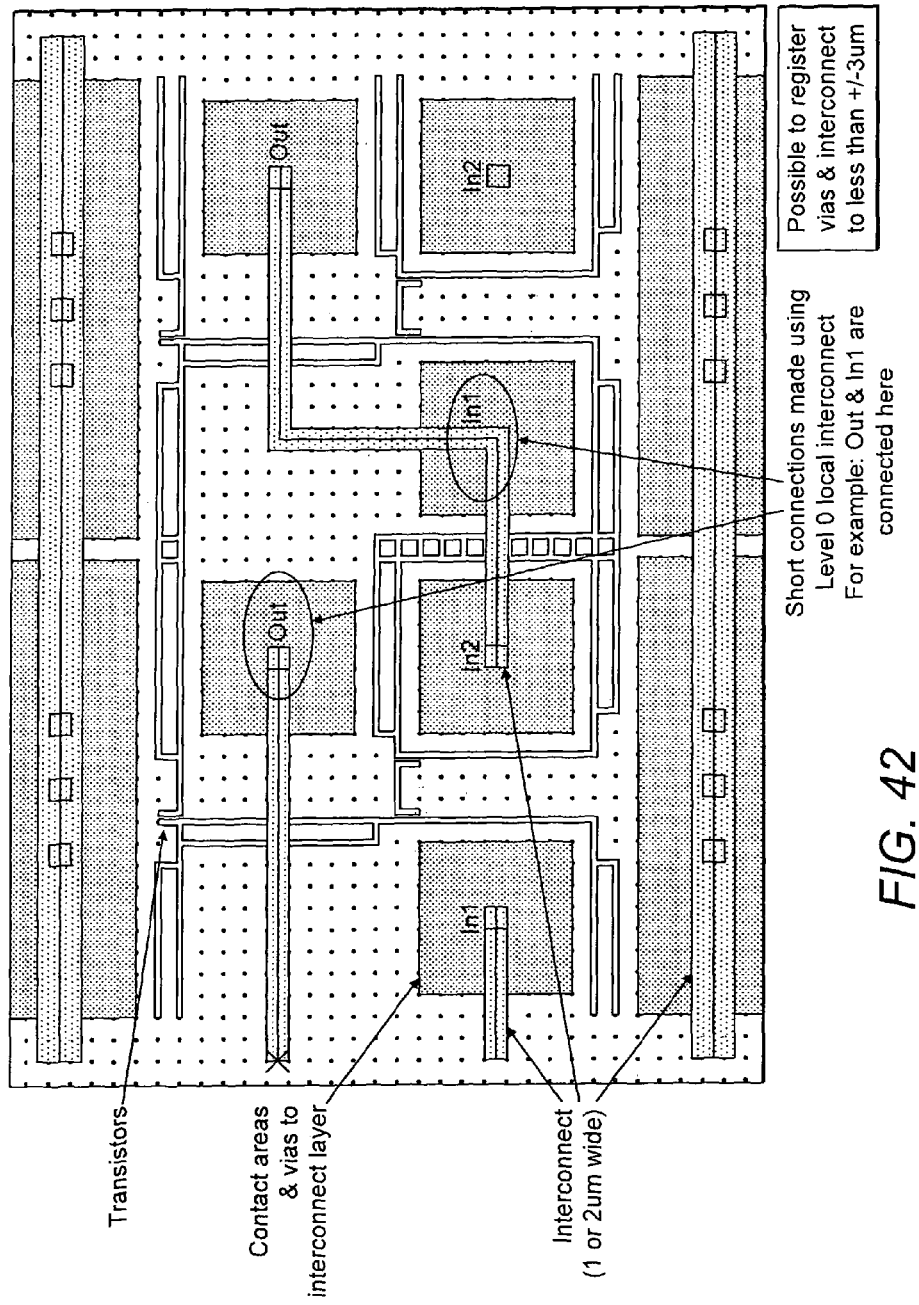
FIG. 42 illustrates part of another electronic circuit embodying the invention, illustrating interconnections provided in the layer of active material and a further plurality of interconnections provided out of the layer, using techniques embodying the invention.

Referring now to FIG. 42, this illustrates the next level of interconnections (level 1: fine interconnects) which are used in certain embodiments of the invention. Again, an active layer of semiconductor material has been patterned with insulative features to define a plurality of substantially planar electronic devices (in this case three inverters or NOT gates in series). The active layer also includes a plurality of contact areas (In1, In2, Out etc) and a layer of insulative material has been formed over the patterned active layer (although the insulative layer is not shown in the figure). Above the insulative layer a plurality of interconnects have been formed, in this example 1 or 2 microns wide, and these interconnects or tracks spaced above the active layer are connected to selected portions of the active layer (i.e. to selected contact areas) by means of vias formed so as to extend down from the interconnect to the underlying active layer. It will be appreciated that in certain embodiments of the invention, short connections can be made in the active layer itself using level 0 local interconnects. Longer range interconnections can be made by means of tracks above the active layer (or below it), separated from the active layer by suitable insulating layer or layers, and connected through to the active layer by means of suitably arranged vias.

Figure 43:
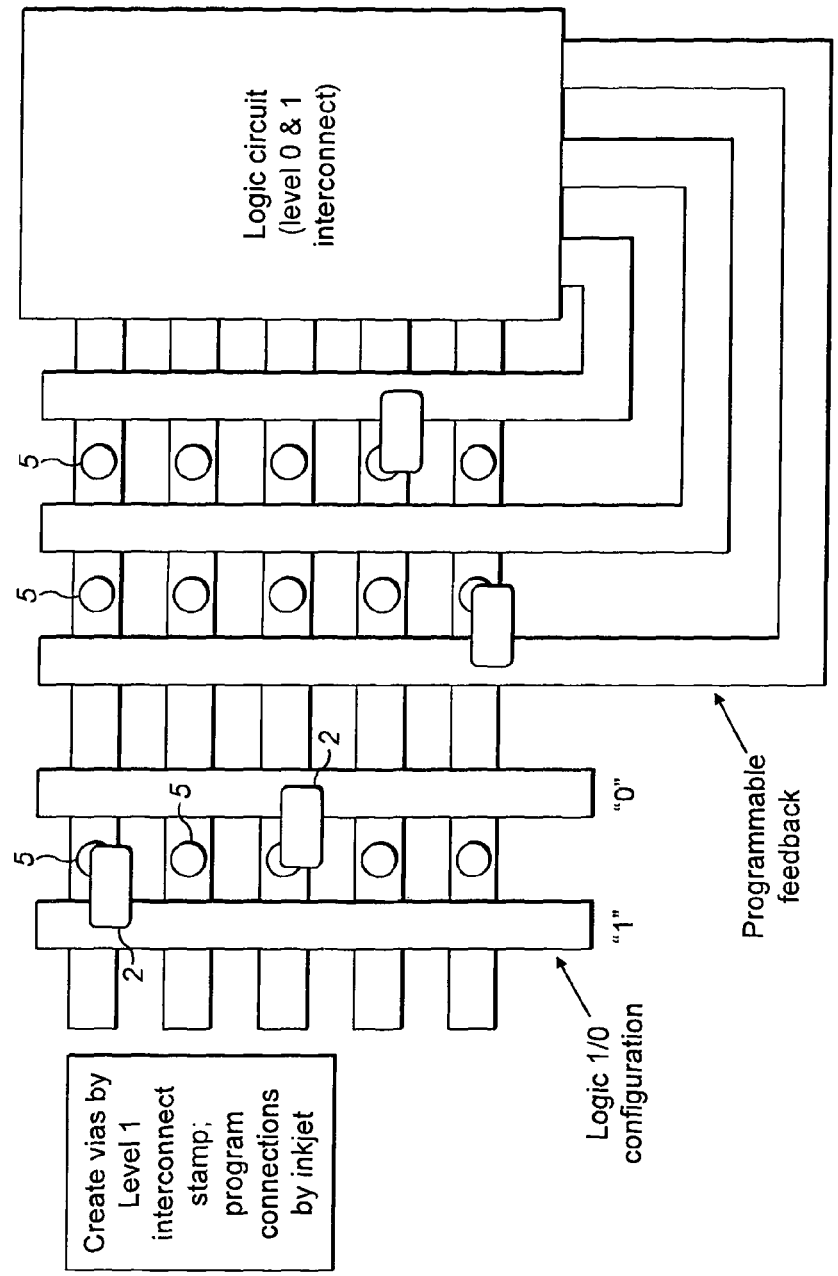
FIG. 43 is a schematic representation of another technique embodying the invention for forming desired interconnections in an electronic circuit.

It will be appreciated that FIG. 38 illustrates a further level of interconnects which may also be employed in embodiments incorporating the structure such as shown in FIG. 42. Referring now to FIG. 43, this shows an alternative way in which the various logic tracks, input tracks, and feedback tracks connecting to the logic circuit (incorporating level 0 and 1 interconnect) may be connected together. Here, a plurality of vias have been formed at various positions to each of the input tracks, but each via 5 does not yet connect two tracks together; it simply makes contact to a respective one of the input tracks. In order to "program" the circuit, it is necessary to form further conductive tracks to those pre-formed vias. Those further conductive tracks 2 are shown at selected positions in the figure, each of these conductive tracks 2 connecting a respective one of the pre-formed vias 5 to one of the logic or feedback tracks.

It will be appreciated that FIG. 39 shows a further level of interconnects (level 3: external pads) which may also be employed in embodiments of the invention incorporating the level 0, 1 and 2 interconnects as described above in relation to FIGS. 41-43

It will be appreciated that certain methods embodying the invention may comprise the following steps:
1. A programmable logic array is designed.
2. Device-to-device interconnects are formed at up to four levels, those levels comprising:
   Level 0: which uses the semiconductor material itself to connect function blocks (for example over 1-10 micron distances).
   Level 1: uses fine interconnects having the same attitude as the devices themselves (0.5-1 micron wide: up to 20 microns distance).
   Level 2: uses programming of pre-existing interconnects (50-100 microns width: 100 microns-1 mm distance).
   Level 3: configures logic by means of external electrodes (0.5-1 mm width: 0.5/100 mm distance).
3. An alternative/additional approach can then use printing to connect together large contact pads (for example by ink jet printing) in order to program/configure the electronic circuit.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

It will be also be appreciated that, throughout the description and claims of this specification, language in the general form of "X for Y" (where Y is some action, activity or step and X is some means for carrying out that action, activity or step) encompasses means X adapted or arranged specifically, but not exclusively, to do Y

The invention claimed is:

1. A method for use in the manufacture of an electronic circuit comprising at least one substantially planar electronic device, the method comprising:
   forming a structure comprising a layer of active material, at least a first conductive track spaced from and extending in a plane generally parallel to the layer of active material, and a layer of insulative material separating the first conductive track from the layer of active material, the layer of active material having a plurality of insulative features formed therein, each insulative feature at least partly inhibiting electrical current flow in the layer of active material and the plurality of insulative features defining at least a first substantially planar electronic device in the layer of active material comprising at least a respective first terminal, a respective second terminal, and a respective conductive channel connecting the first terminal to the second terminal, each terminal and channel comprising a respective area of the layer of active material, the plurality of insulative features in direct contact with each of the first and second terminals and sides of each channel, and at least a portion of said first conductive track overlapping one of the first and second terminals;
   forming a first hole in said structure, said first hole extending through the layer of insulative material and connecting an overlapping portion of the first conductive track to one of the first and second terminals; and
   filling said first hole at least partly with electrically conductive material so as to provide an electrical connection between the first conductive track and one of the first and second terminals.

2. A method in accordance with claim 1, wherein a first portion of the first track overlaps the first terminal and a second portion of the first track overlaps the second terminal, and forming the first hole comprises forming the first hole so as to connect a selected one of the first and second portions to a corresponding one of the first and second terminals, whereby said filling provides an electrical connection between the first conductive track and a selected one of the first and second terminals.

3. A method in accordance with claim 1, wherein a first portion of the first track overlaps the first terminal and a second portion of the first track overlaps the second terminal, and forming the first hole comprises forming the first hole so as to connect the first portion to the first terminal, the method further comprising forming a second hole in said structure, the second hole extending through the layer of insulative material and connecting the second portion to the second terminal, and filling the first and second holes at least partly with electrically conductive material so as to provide electrical connections between the first conductive track and the first and second terminals.

4. A method in accordance with claim 1, wherein a further portion of the first conductive track overlaps a further area of active material in the layer of active material, the method further comprising forming a further hole in said structure, the further hole extending through the layer of insulative material and connecting the further portion to the further area, and filling the further hole at least partly with electrically conductive material so as to provide an electrical connection between the first conductive track and the further area.

5. A method in accordance with claim 4, wherein the further area is a terminal of a second substantially planar electronic device defined in the layer of active material by the plurality of insulative features.

6. A method in accordance with claim 1, wherein the plurality of insulative features define a plurality of substantially planar electronic devices, including said first device, in the layer of active material, each device comprising at least a respective first terminal and a respective second terminal, and said first conductive track overlaps at least one of the respective first and second terminals of each of said plurality of devices.

7. A method in accordance with claim 6, further comprising selecting to form said first hole so as to selectively connect the first track to the first device from the plurality of devices.

8. A method in accordance with claim 6, further comprising: forming a plurality of holes in the structure, the plurality of holes including said first hole, and each hole extending through the layer of insulative material and connecting an overlapping portion of the first conductive track to one of the first and second terminals of a respective one of the plurality of devices; and filling each hole at least partly with electrically conductive material so as to provide a respective electrical connection between the first conductive track and one of the first and second terminals of a respective one of the plurality of devices.

9. A method in accordance with claim 8, wherein the number of said holes is smaller than the number of said devices, such that the method provides electrical connections between the first track and a selected subset of the plurality of devices.

10. A method in accordance claim 1, wherein said structure comprises a second conductive track, at least a respective portion of each of the first and second tracks overlaps the first terminal of the first device.

11. A method in accordance with claim 10, further comprising selecting to form said first hole so as to selectively connect the first terminal of the first device to the first track and not the second track.

12. A method in accordance with claim 10, wherein said first hole connects the first track to the first terminal of the first device, and the method further comprises:
    forming an additional hole in said structure, said additional hole extending through the layer of insulative material and connecting an overlapping portion of the second conductive track to the first terminal; and
    filling said additional hole at least partly with electrically conductive material so as to provide an electrical connection between the second conductive track and the first terminal.

13. A method in accordance with claim 1, wherein said structure comprises a second conductive track, at least a portion of the first track overlapping the first terminal of the first device and at least a portion of the second track overlapping the second terminal of the first device.

14. A method in accordance with claim 13, wherein said first hole connects the first track to the first terminal of the first device, and the method further comprises:
    forming an additional hole in said structure, said additional hole extending through the layer of insulative material and connecting an overlapping portion of the second conductive track to the second terminal; and
    filling said additional hole at least partly with electrically conductive material so as to provide an electrical connection between the second conductive track and the second terminal.

15. A method in accordance with claim 1, wherein forming the or each hole comprises forming the or each hole using a technique selected from a list comprising: drilling; punching; etching; imprinting; ablating; chemical lift-off.

16. A method in accordance with claim 1, wherein forming the or each hole comprises shaping the or each hole to facilitate filling with electrically conductive material.

17. A method in accordance with claim 1, wherein the or each hole is tapered.

18. A method in accordance with claim 1, wherein filling the or each hole comprises filling the or each hole using a technique selected from a list comprising: filling with a conductive ink; sputter-coating; vacuum evaporation; fluidic wicking; coating; printing.

19. A method in accordance with claim 1, wherein forming said structure comprises forming the or each conductive track on a surface of the layer of insulative material.

20. A method in accordance with claim 19, wherein the or each conductive track is formed on said surface using a technique selected from a list comprising: deposition; deposition and selected removal; coating; printing.

21. A method in accordance with claim 1, wherein forming said structure comprises forming the or each conductive track in a respective trench, groove, recess or depression in a surface of the layer of insulative material.

22. A method in accordance with claim 1, wherein said first device comprises a channel of active material defined by said insulative features, the channel having a conductivity dependent upon a voltage applied to at least one terminal of the first device.

23. A method in accordance with claim 22, wherein the first device comprises at least one side gate terminal, adjacent the channel, to which a potential may be applied to control the conductivity of the channel.

24. A method in accordance with claim 22, wherein said channel connects the first and second terminals of the first device.

25. A method in accordance with claim 22, wherein at least one of the first and second terminals of the first device is a side gate terminal, adjacent the channel, to which a potential may be applied to control the conductivity of the channel.

26. A method in accordance with claim 22, wherein the channel has a width in the range: 30-300 nm and a length in the range: 200-2000 nm.

27. A method in accordance with claim 1, wherein said structure is formed such that the layer of insulative material is in direct contact with the layer of active material.

28. A method in accordance with claim 1, wherein said structure comprises at least one intermediate layer separating the layer of active material from the layer of insulative material.

29. A method in accordance with claim 1, wherein the layer of insulative material is a first layer of insulative material and said structure comprises a second layer of insulative material and at least one further conductive track, each further conductive track extending in a plane generally parallel to the layer of active material and being separated from the layer of active material by the second layer of insulative material, the method further comprising forming at least one hole extending from a respective area of the layer of active material, to a respective further conductive track and filling that hole at least partly with electrically conductive material to form an electrical connection between the respective area of the layer of active material and the respective further conductive track.

30. A method in accordance with claim 29, wherein the first and second layers of insulative material are arranged on opposite sides of the layer of active material.

31. A method of manufacturing an electronic circuit comprising a plurality of substantially planar electronic devices, the method comprising:
    forming a structure comprising a layer of active material, a plurality of conductive tracks spaced from and extending in a plane generally parallel to the layer of active material, and a layer of insulative material separating the conductive tracks from the layer of active material, the layer of active material having a plurality of insulative features formed therein, each insulative feature at least partly inhibiting electrical current flow in the layer of active material and the plurality of insulative features defining a plurality of substantially planar electronic devices in the layer of active material, each device comprising at least a respective first terminal, a respective second terminal, and a respective conductive channel connecting the first terminal to the second terminal, each terminal and channel comprising a respective area of the layer of active material, the plurality of insulative features in direct contact with each of the first and second terminals and sides of each channel, and said conductive tracks overlapping said terminals at a plurality of positions;

forming a plurality of holes in said structure, each hole extending through the layer of insulative material and connecting a selected overlapping portion of a conductive track to a selected terminal; and filling each hole at least partly with electrically conductive material such that the filled holes provide a plurality of electrical connections between the conductive tracks and the terminals.

32. A method in accordance with claim 29, wherein the plurality of insulative features define a second plurality of electrical connections between the device terminals and in the layer of active material.

33. An electronic circuit manufactured using a method in accordance with claim 1.

34. An electronic circuit manufactured using a method in accordance with claim 31.

* * * * *